United States Patent
Hara

(10) Patent No.: US 8,264,012 B2
(45) Date of Patent: Sep. 11, 2012

(54) SEMICONDUCTOR DEVICE AND MANUFACTURING METHOD THEREOF

(75) Inventor: Akito Hara, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 24 days.

(21) Appl. No.: 12/908,231

(22) Filed: Oct. 20, 2010

(65) Prior Publication Data

US 2011/0031540 A1 Feb. 10, 2011

Related U.S. Application Data

(60) Division of application No. 11/362,530, filed on Feb. 27, 2006, now Pat. No. 7,847,321, which is a continuation-in-part of application No. 11/167,580, filed on Jun. 28, 2005, now abandoned.

(30) Foreign Application Priority Data

Feb. 28, 2005 (JP) ................................. 2005-054629
Jan. 24, 2006 (JP) ................................. 2006-015509

(51) Int. Cl.
*H01L 29/76* (2006.01)
(52) U.S. Cl. ................. 257/213; 257/288; 257/E29.255
(58) Field of Classification Search .................... 257/213
See application file for complete search history.

(56) References Cited

U.S. PATENT DOCUMENTS

| | | | |
|---|---|---|---|
| 5,698,869 A | 12/1997 | Yoshimi et al. | |
| 5,908,313 A | 6/1999 | Chau et al. | |
| 6,541,343 B1 | 4/2003 | Murthy et al. | |
| 6,852,604 B2 | 2/2005 | Baba | |
| 7,009,279 B2 | 3/2006 | Nasu et al. | |
| 2003/0227061 A1 | 12/2003 | Yokogawa et al. | |
| 2006/0131672 A1 | 6/2006 | Wang et al. | |
| 2007/0252203 A1* | 11/2007 | Zhu et al. ...................... | 257/345 |

FOREIGN PATENT DOCUMENTS

| JP | 3361922 B2 | 1/2003 |
|---|---|---|
| JP | 2003-347399 A | 12/2003 |
| JP | 2004-335904 A | 11/2004 |
| WO | 2005-013344 A1 | 2/2005 |

OTHER PUBLICATIONS

"Research Report on Control of Material Function Utilizing Semiconductor Lattice Defect," The Society of Non-Traditional Technology, 1986, pp. 72-74.
Goto, K. et al "Technology Booster using Strain-Enhancing Laminated SiN (SELS) for 65nm Node HP MPUs," IEEE, Dec. 2004, pp. 209-212.
Shimizu, A. et al "Local Mechanical-Stress Control (LMC): A New Technique for CMOS-Performance Enhancement," IEEE Electron Devices Meeting, Dec. 2001.
Japanese Office Action dated Oct. 4, 2011, issued in corresponding Japanese Patent Application No. 2006-015509.

* cited by examiner

*Primary Examiner* — Tony Tran
(74) *Attorney, Agent, or Firm* — Westerman, Hattori, Daniels & Adrian, LLP

(57) ABSTRACT

A semiconductor device includes a field effect transistor and a strain generating layer to apply a stress to a channel region of the field effect transistor. The strain generating layer contains at least one of oxygen and nitrogen of $1.0 \times 10^{18}$ cm$^{-3}$ to $5.0 \times 10^{19}$ cm$^{-3}$, or alternatively, the strain generating layer contains self-interstitial atoms and/or vacancies of $1.0 \times 10^{18}$ cm$^{-3}$ to $5.0 \times 10^{19}$ cm$^{-3}$. In the latter case, at least a portion of the self-interstitial atoms and/or the vacancies exist as a cluster.

1 Claim, 30 Drawing Sheets

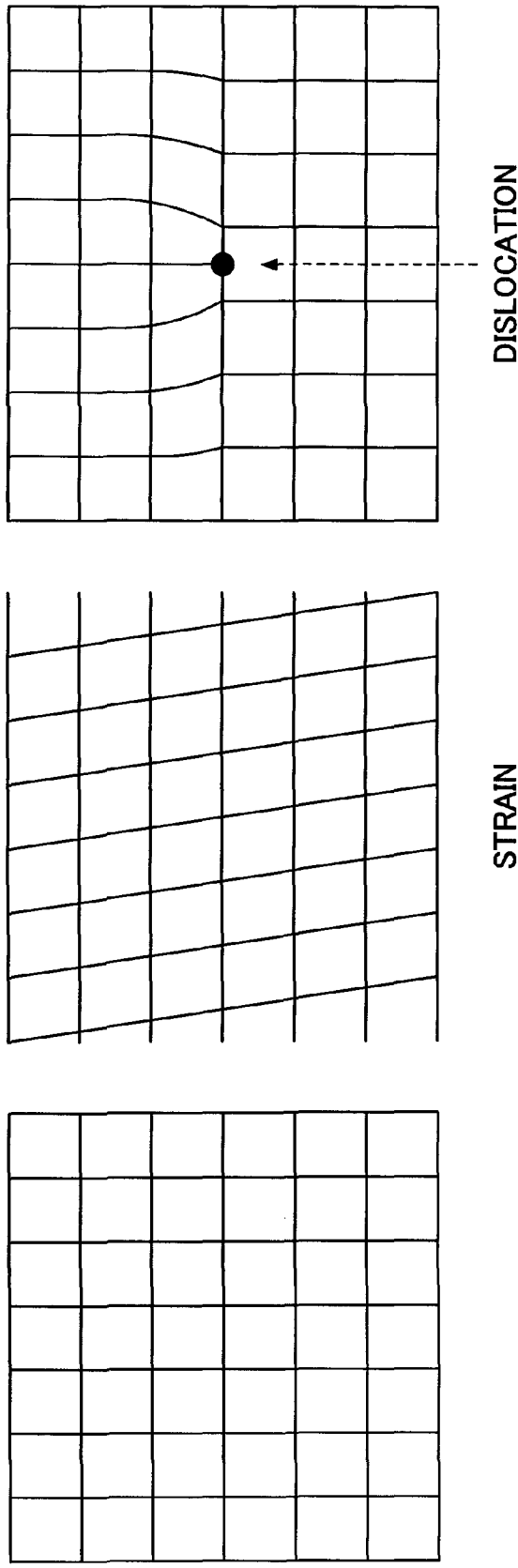

FIG.7

| CRYSTAL | IMPURITY (at.ppm) | CRITICAL STRESS TO STOP MOTION (MN/m$^2$) |
|---|---|---|
| FZ Si (FLOATING ZONE METHOD) | B: 0.00004 | <1.2 |
| | C: 2.0 | <1.2 |
| | N: 0.11 | 4.2 |
| | P: 240 | 8.5 |
| MCZ Si (MAGNETIC CZOCHRALSKI METHOD) | O: 3.0 | <1.2 |
| | O: 5.0 | 1.8 |
| CZ Si (CZOCHRALSKI METHOD) | O: 15 | 3.0 |
| | O: 18 | 8.0 |
| | P: 120 (O:~12) | 4.5 |
| | P: 300 (O:~12) | 11.0 |
| | B: 280 (O:~14) | 5.0 |

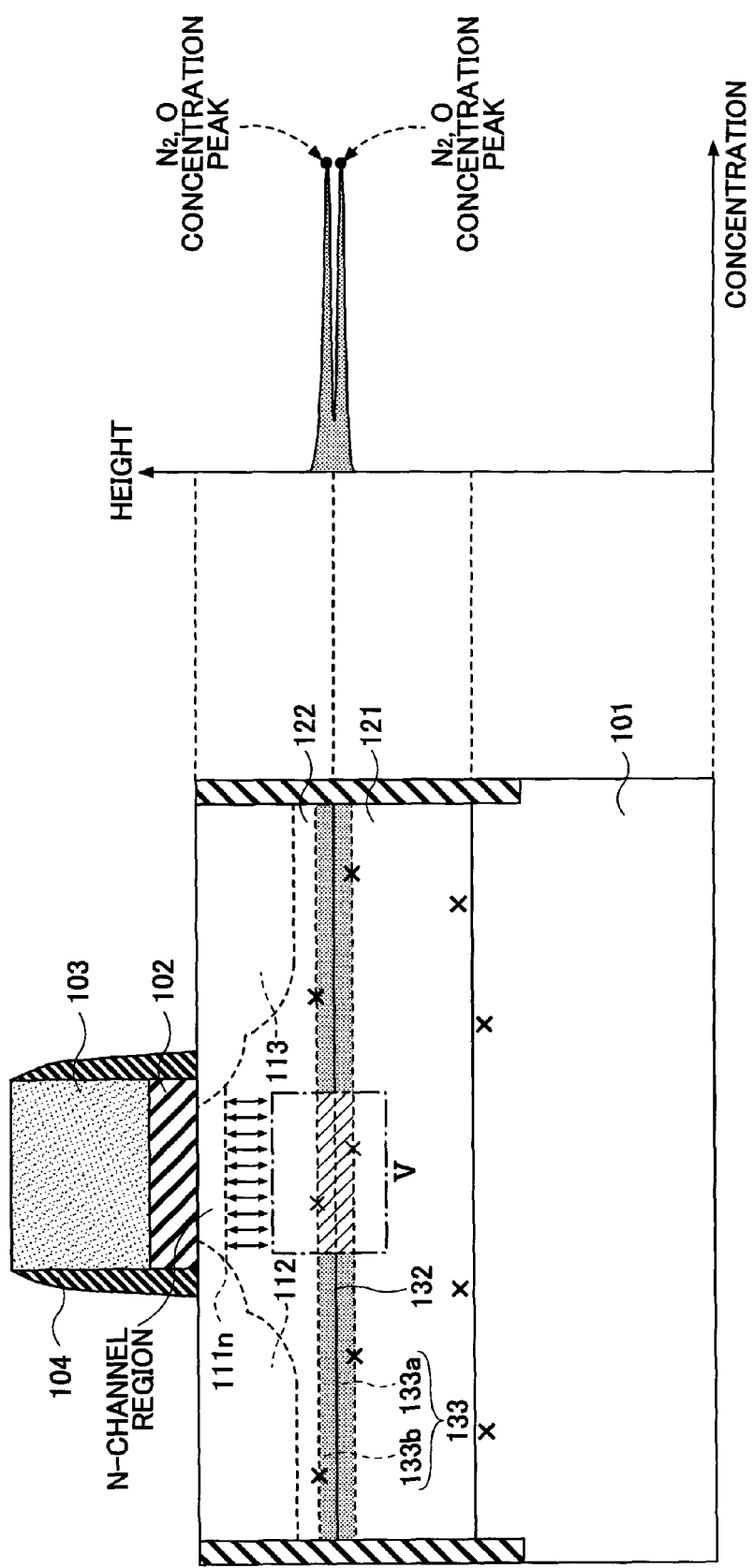

FIG.14

|  | OUT-OF-PLANE | IN-PLANE |
|---|---|---|
| OXYGEN IMPLANTATION | 5.4572(Å) | 5.432(Å) |
| As GROWN | 5.4556(Å) | 5.432(Å) |

550 °C, 210 min

AS GROWN

700 °C, 5 min

NITROGEN IMPLANTATION
(45KeV, 1E14cm$^{-2}$)

700 °C, 5 min

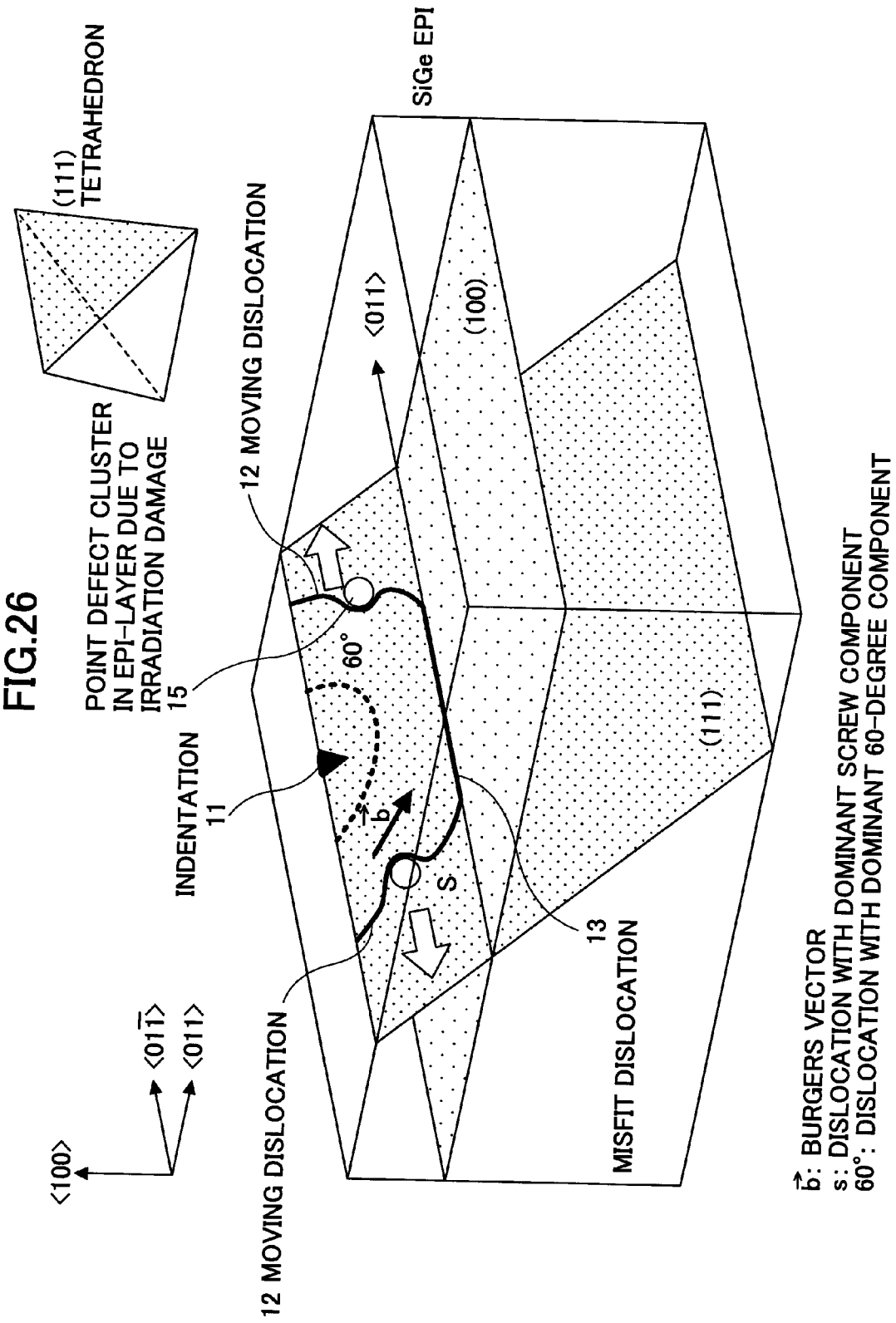

SEMICONDUCTOR DEVICE AND MANUFACTURING METHOD THEREOF

CROSS-REFERENCE TO A RELATED APPLICATION

This application is a divisional of U.S. application Ser. No. 11/362,530, filed on Feb. 27, 2006, which is a continuation in part of U.S. application Ser. No. 11/167,580, filed Jun. 28, 2005, which is based upon and claims the benefit of the earlier filing dates of Japanese Patent Application Nos. 2005-054629 and 2006-015509 filed Feb. 28, 2005 and Jan. 24, 2006, respectively, the entire contents of which are hereby incorporated by reference.

BACKGROUND OF THE INVENTION

1. Field of the Invention

The present invention relates to a semiconductor device and a manufacturing method thereof.

2. Description of the Related Art

Field Effect Transistors (FETs) have a characteristic in that strain in channel regions improves carrier mobility. "Strain generating techniques" for causing strain in channel regions are attracting increased interest for application to super speed FETs having a gate length of 100 nm or less. FIG. 1A illustrates an example of strain generating methods. According to this method, a silicon (Si) layer having an N-channel region is formed on the surface of a silicon-germanium (SiGe) layer. Thus, a biaxial tensile stress is applied to the N-channel to cause strain therein. FIG. 1B illustrates another example of strain generating methods. According to this method, SiGe layers are embedded into a silicon (Si) layer. Thus, a uniaxial compressive stress is applied to a P-channel region to cause strain therein (see Reference 1: A. Shimizu et al., Tech. Dig. of 2001 IEDM, IEEE, 2001, pp. 443-436; and Reference 2: K. Goto et al., Tech. Dig. of 2004 IEDM, IEEE, 2004, pp. 209-212). In these strain generating methods, the difference between the Si lattice constant and the SiGe lattice constant is a factor in generating a stress.

When a crystal shown in FIG. 2A is strained as illustrated in FIG. 2B, dislocation (FIG. 2C) is activated and expanded in the crystal under high temperature and high stress conditions. The term "dislocation" indicates line crystal defects. The types of dislocation include edge dislocation and screw dislocation. When the dislocation is activated and expanded in the strained crystal, the strain in the crystal is relieved by the dislocation.

The dislocation is not caused by self-nucleation. There is always a source that causes initial dislocation. In the case of the strain generating method of FIG. 1A, the dislocation source may be, for example, through penetration that has occurred when the SiGe layer or the Si layer is formed. In the case of the strain generating method of FIG. 1B, the dislocation source may be, for example, a lattice defect due to etching damage caused when grooves for layer embedment are formed. The (111) facet produced during the etching process also causes lattice defects. When the wafer is processed at high temperature, the initial dislocation is activated in the Si layer or the SiGe layers and expanded in the Si layer or the SiGe layers, as illustrated in FIG. 3. The quantity of strain $\Delta X$ after dislocation is produced is expressed as $$\Delta X = \Delta X_0 - A|b|N$$

where $X_0$ is an initial strain, N is a density of dislocation in the system, A is a constant of proportion, and b is a Burger's vector ($|b|$ denotes the size of the Burger's vector).

The dislocation thus relieves the strain in the channel region, thereby lowering the strain effect in the channel region for carrier mobility enhancement. This results in degradation of the performance of semiconductor devices, and increased fluctuation and variation in device characteristics.

SUMMARY OF THE INVENTION

A general object of the present invention is to provide a semiconductor device to solve at least one problem described above. In the embodiments, a semiconductor device having a strained channel region with enhanced carrier mobility is provided, in which the strain effect is appropriately maintained by preventing relief of the strain.

In the first aspect of the invention, a semiconductor device comprises a field effect transistor, and a strain generating layer to apply a stress to a channel region of the field effect transistor, wherein the strain generating layer contains self-interstitial atoms and/or vacancies of $1.0 \times 10^{18}$ cm$^{-3}$ to $5.0 \times 10^{19}$ cm$^{-3}$, and at least a portion of the self-interstitial atoms and/or the vacancies exist as a cluster.

For example, the strain generating layer is a global strain generating layer located under the semiconductor layer in which the channel region exists. Alternatively, the stain generating layer may be a localized strain generating layer located on both sides of the semiconductor layer in which the channel region exists.

In the second aspect of the invention, a semiconductor device comprises a field effect transistor and a strain generating layer to apply a stress to a channel region of the field effect transistor, wherein the strain generating layer contains at least one of oxygen and nitrogen of $1.0 \times 10^{18}$ cm$^{-3}$ to $5.0 \times 10^{19}$ cm$^{-3}$.

In the third aspect of the invention, a semiconductor device manufacturing method includes the steps of:

(a) forming a strain generating layer in or on a semiconductor substrate so as to apply a stress to a semiconductor layer that is to serve as a channel region of a field effect transistor;

(b) introducing an impurity into the strain generating layer and/or the semiconductor layer to produce self-interstitial atoms, vacancies, and clusters thereof; and (c) forming the field effect transistor on the semiconductor layer.

With the above-described structure and method, the self-interstitial atoms and vacancies existing as clusters suppress dislocation mobility, and therefore the strain given by the strain generating layer can be maintained, while preventing the strain from being relieved.

If the impurity is oxygen or nitrogen, the density of the generated dislocation can also be reduced (the dislocation pinning effect), in addition to the effect of reducing dislocation mobility.

Consequently, in a semiconductor device configured to improve the carrier mobility by applying strain to the channel region, the stain generating effect is appropriately maintained, while preventing the strain from being relieved.

BRIEF DESCRIPTION OF THE DRAWINGS

FIGS. 2A through 2C are schematic cross-sectional views of a crystal for illustrating dislocation;

FIG. 7 is a table showing a relationship between impurity concentration and a dislocation pinning effect;

FIG. 11 shows a cross-sectional view of a semiconductor device for illustrating impurity regions according to the second embodiment;

FIG. 14 is table showing an increase of lattice constant in the Z-axis direction based on the X-ray diffraction result of the oxygen implanted sample;

FIG. 26 is a schematic diagram for explaining the mechanism of preventing dislocation motion achieved by impurity implantation.

DETAILED DESCRIPTION OF THE PREFERRED EMBODIMENT

Figure 4:
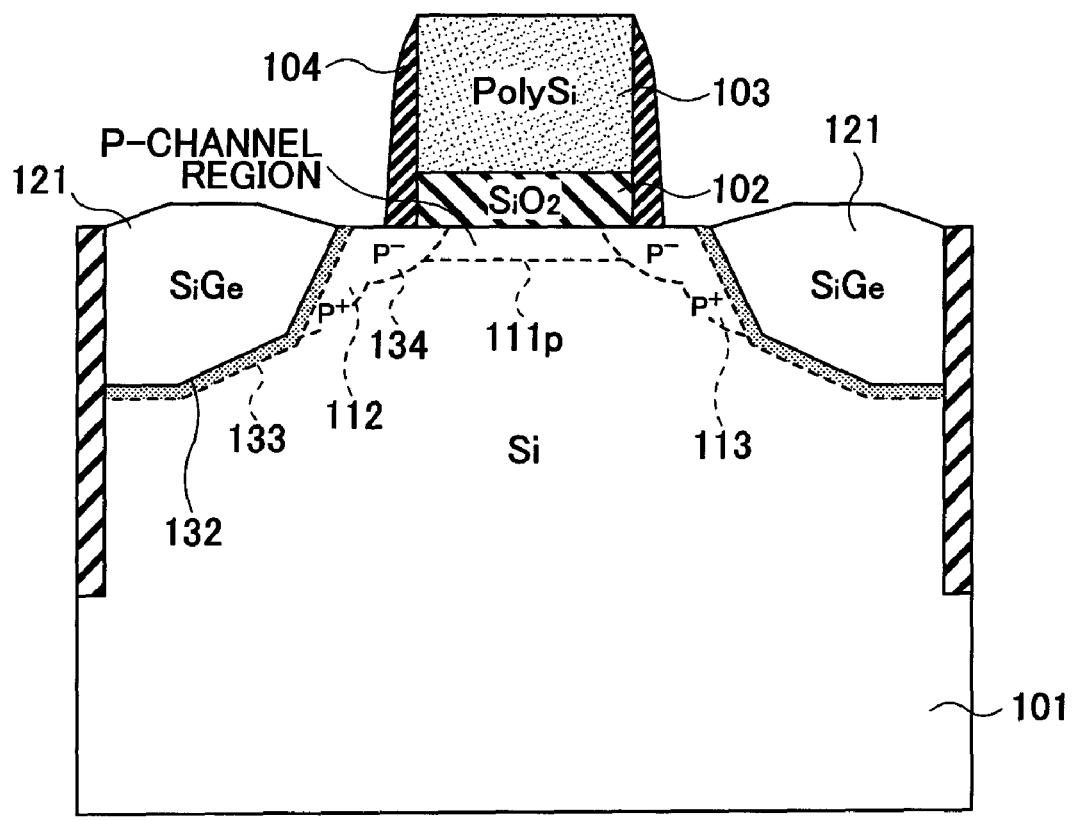
FIG. 4 shows a cross-sectional view of a semiconductor device according to a first embodiment.

FIG. 4 is a cross-sectional view of a semiconductor device according to the first embodiment of the invention, and FIGS. 5A through 5E illustrate a semiconductor device fabrication method according the first embodiment. In the first embodiment, a semiconductor device with a p-type MOSFET is fabricated.

The semiconductor device shown in FIG. 4 comprises a silicon (Si) substrate 101, a gate insulating film 102, a gate electrode 103, and a sidewall 104. The silicon substrate 101 includes a p-channel region 111$p$, a source region 112, a drain region 113, and source/drain extensions (hereinafter referred to simply as "extensions") 134.

The semiconductor device also comprises strain generating layers 121 that cause strain in the p-channel region 111$p$ by applying a uniaxial compressive stress thereto. The strain generating layers 121 are localized strain generating layers embedded in grooves 131 (See FIG. 5D) formed one in each of the source region 112 and the drain region 113 to be in contact with the semiconductor substrate 101. The semiconductor substrate 101 is made of Si, while the strain generating layers 121 are made of SiGe. The difference between the Si lattice constant and the SiGe lattice constant is a factor of generating the uniaxial compressive stress. In the example shown in FIG. 4, the SiGe strain generating layer 121 is provided in the p-type MOSFET. If the channel region 111 is of an n-type, then the strain generating layer 121 may be formed of carbon doped Si.

The semiconductor device comprises impurity regions 133 each formed in the vicinity of corresponding interfaces 132 between the semiconductor substrate 101 and the SiGe strain generating layers 121. The impurity regions 133 contain nitrogen or oxygen as impurities. The presence of nitrogen or oxygen ions in or near the SiGe strain generating layers 121 can reduce the density of generated dislocations (i.e., provide a dislocation pinning effect).

Figure 6:
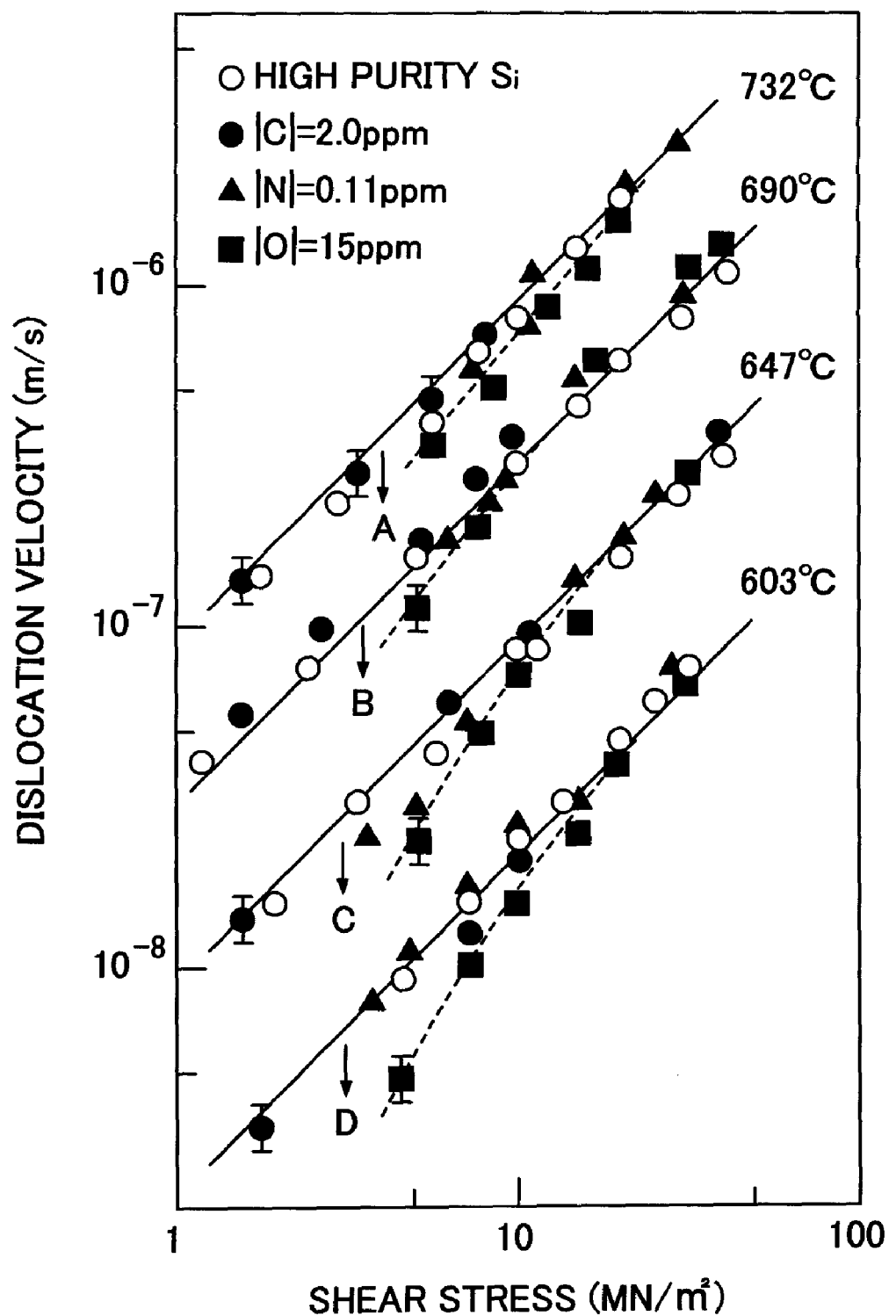
FIG. 6 is a graph showing a relationship between presence of impurities and a dislocation pinning effect.

FIG. 6 is a graph showing reduction of the dislocation motion velocity achieved by introducing impurities. It is understood from the graph that, especially in the initial state in which dislocation has just started running (with small shear stress applied), the dislocation motion velocity is reduced due to existence of nitrogen or oxygen ions, as indicated by arrows A, B, C, and D.

This means that if the impurity regions 133 are formed on or in the silicon substrate 101 and the SiGe strain generating layers 121, initial dislocation in the silicon substrate 101 and the SiGe strain generating layers 121 is locked, thereby preventing activation and expansion of dislocation in the silicon substrate 101 and the SiGe strain generating layers 121 even under application of high temperature and high pressure.

For this reason, the impurity regions 133 are provided in the vicinity of the interfaces 132 between the silicon substrate 101 and the SiGe strain generating layers 121 in this embodiment. The lowering of a strain effect in the channel region 111$p$ for carrier mobility enhancement is thus prevented.

It is preferred that the concentration of the impurities presented in the impurity regions 133 be $1.0 \times 10^{18}$ cm$^{-3}$ through $5.0 \times 10^{19}$ cm$^{-3}$. If the impurity concentration exceeds the upper limit, the silicon gets nitrided or oxidized to turn into silicon nitride or silicon oxide. If the impurity concentration is below the lower limit, the dislocation pinning effect becomes insufficient.

FIG. 7 is a table showing the relationship between the impurity concentration and the dislocation pinning effect The concentration of the impurities that can achieve a critical stress to stop motion (at or below which level dislocation motion is stopped) is 0.11 ppm substantially equivalent to $5.5 \times 10^{15}$ cm$^{-3}$ in theory with nitrogen impurities, and is 5.0 ppm substantially equivalent to $2.5 \times 10^{17}$ cm$^{-3}$ in theory with oxygen impurities. However, in order to sufficiently reduce the dislocation mobility in the actual device, it is desired for the impurity concentration to be in the range of $1.0\times10^{18}$ cm$^{-3}$ to $5.0\times10^{19}$ cm$^{-3}$. Next, explanation is made of how the semiconductor device shown in FIG. 4 is fabricated in conjunction with FIG. 5A through FIG. 5E.

Figure 5A:
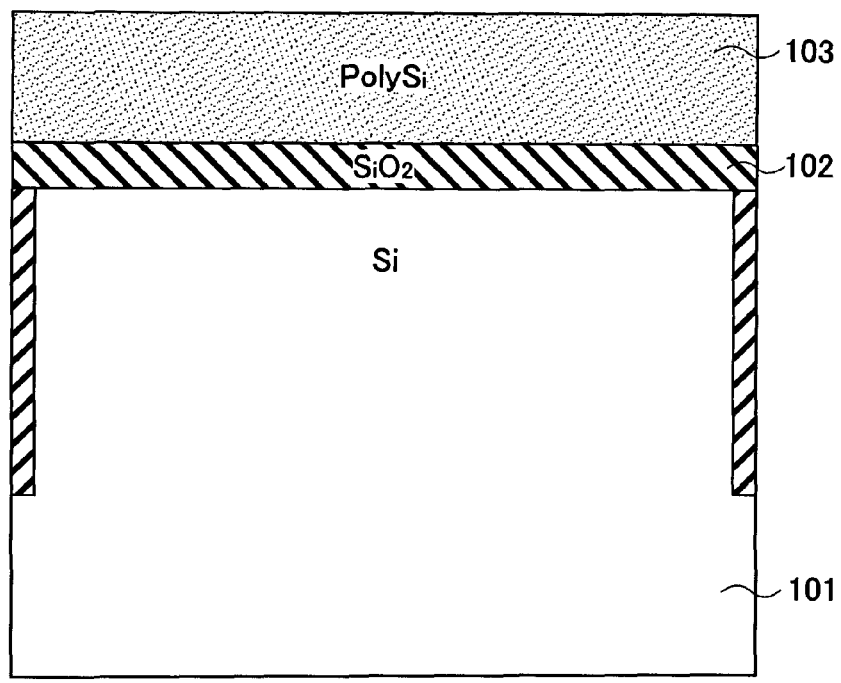
FIGS. 5A through 5E show cross-sectional views of a semiconductor device for illustrating a manufacturing method thereof according to the first embodiment.

First, referring to FIG. 5A, a SiO$_2$ (silicon oxide) film 102 having a thickness of 2 nm is deposited on a surface of the semiconductor substrate 101 of Si by a thermal oxidation process. A polysilicon (PolySi) layer 103 having a thickness of 100 nm is deposited on a surface of the SiO$_2$ film 102 by a CVD process.

Figure 5B:
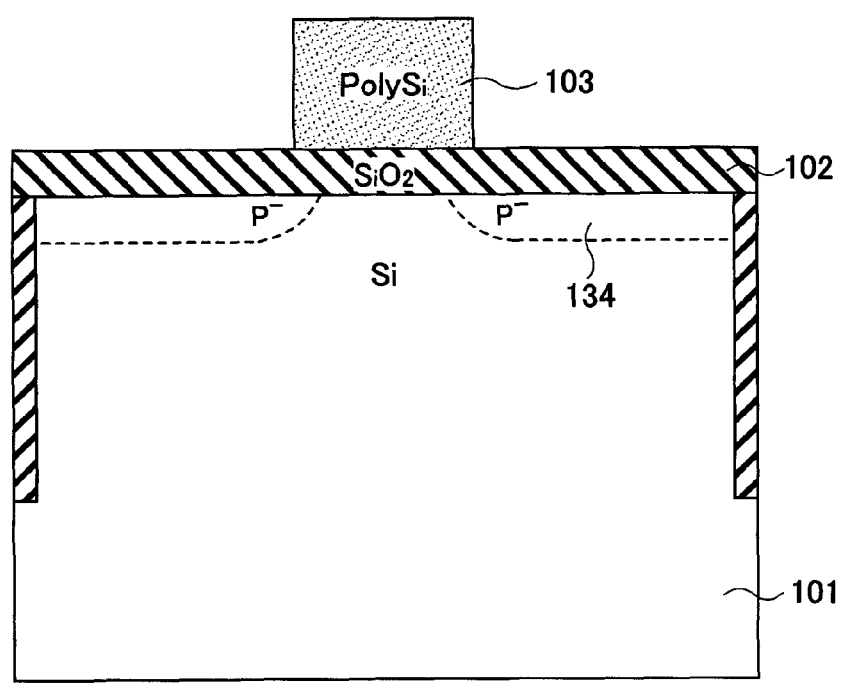

Then, referring to FIG. 5B, the polysilicon gate electrode 103 is formed by a dry etching process. Subsequently, P$^-$ regions (extensions) 134 are formed in the silicon substrate 101 by ion implantation through the SiO$_2$ film 102 at acceleration energy of 5 KeV using the gate electrode 103 as a mask.

Figure 5C:
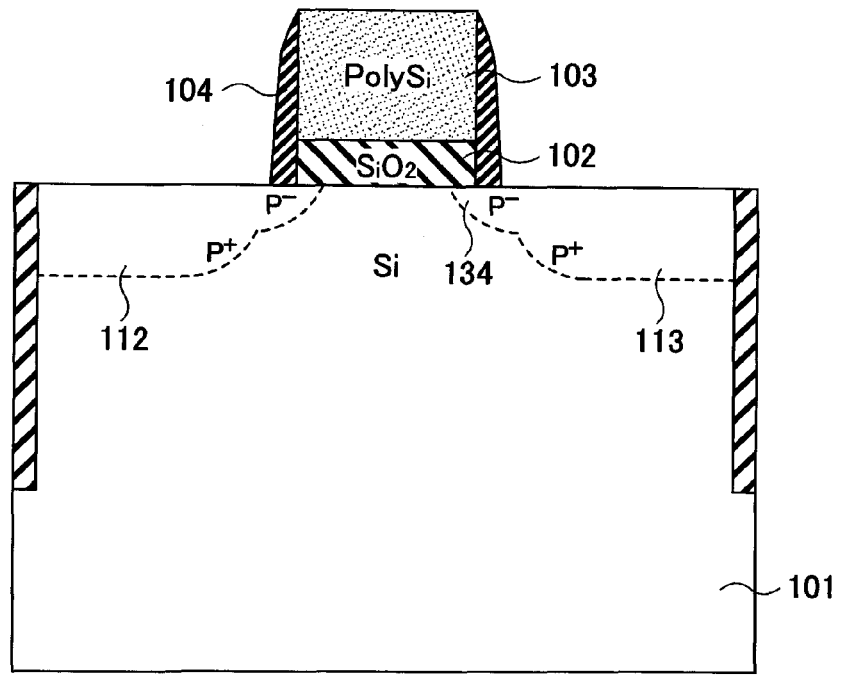

Then, referring to FIG. 5C, SiO$_2$ film 102 is patterned into a gate insulating film 102 by an etch back method. A silicon nitride (SiN) film is deposited over the entire surface, and SiN sidewall 104 is formed by anisotropic etching. Subsequently, P$^+$ regions (source/drain regions) 112 and 113 are formed in the silicon substrate 101 by ion implantation using the gate electrode 103 and the sidewall 104 as a mask.

Figure 5D:
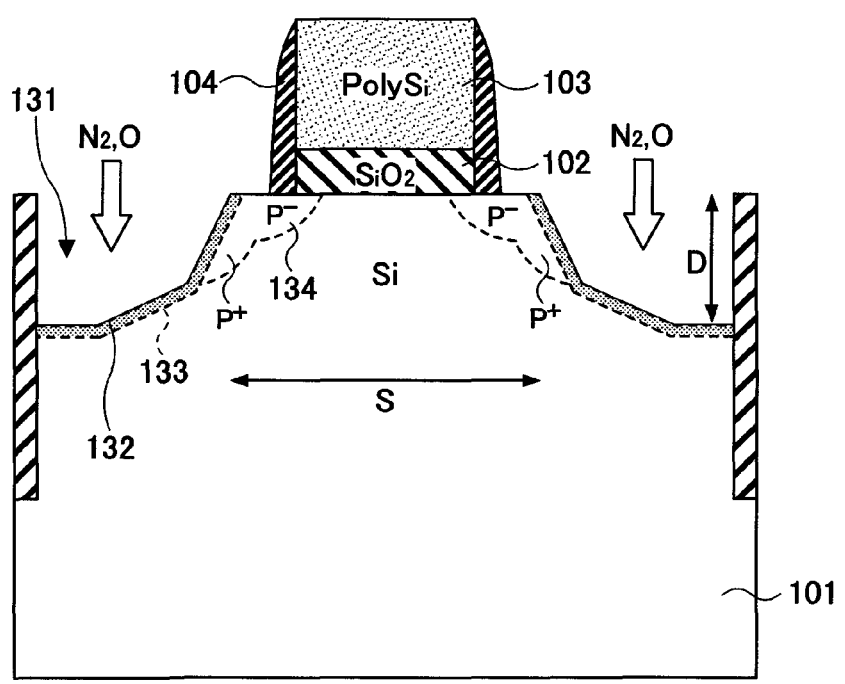

Then, referring to FIG. 5D, grooves 131 are formed by a dry etching process in the p+ source/drain regions. The depth (D in FIG. 5D) of the grooves 131 is around 50 nm, and the interval (S in FIG. 5D) between the grooves 131 is around 200 nm. The impurity regions 133 are formed in the vicinity of corresponding surfaces 132 of the grooves 131 by injecting oxygen ions or nitrogen ions by ion implantation at injection energy of 10 KeV to 40 KeV. The thickness of the impurity regions 133 is 10 nm to 40 nm, and the concentration of the impurities in the impurity regions 133 is $1.0\times10^{18}$ cm$^{-3}$ to $5.0\times10^{19}$ cm$^{-3}$. Subsequently, an annealing process is performed for restoring etching damage and implantation damage, and for pinning lattice defects and initial dislocation. The annealing process is performed for several seconds using an RTA at 800° C. through 1000° C.

Figure 5E:
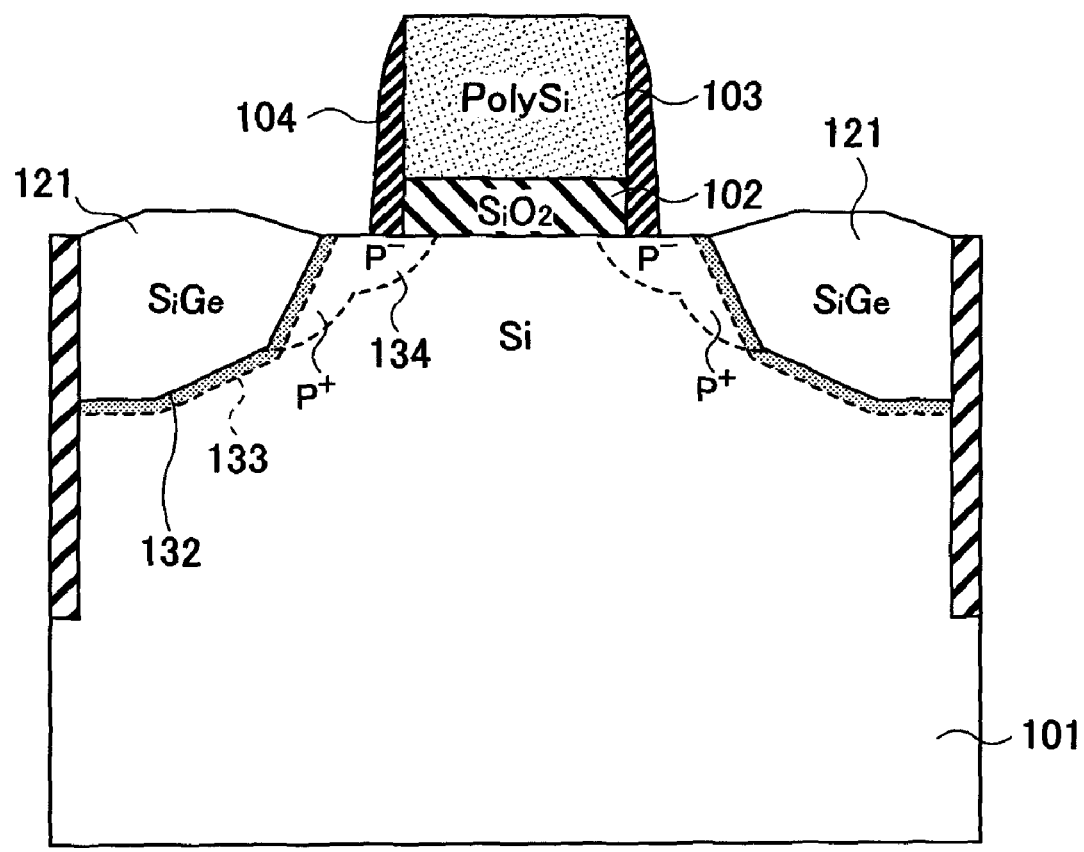

Then, referring to FIG. 5E, SiGe layers 121 are embedded into the grooves 131 by a CVD process to form the SiGe strain generating layers 121.

Figure 1A:
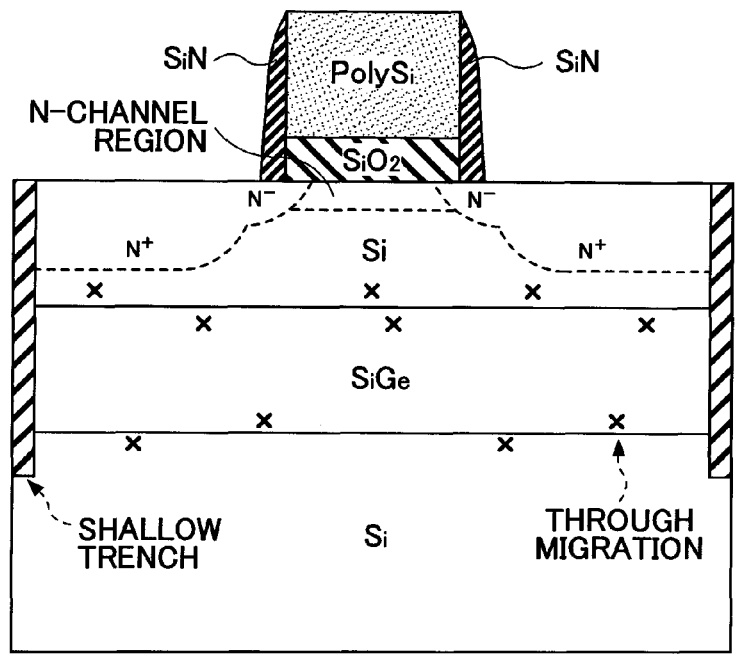
FIG. 1A shows a cross-sectional view of a semiconductor device formed by a strain generating method of causing strain in an n-type channel region by application of a biaxial tensile stress.
Figure 1B:
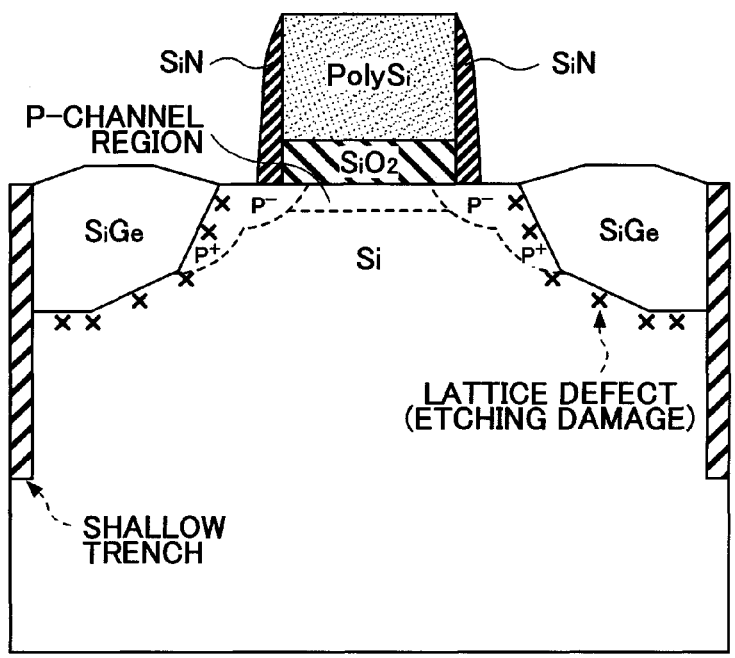
FIG. 1B shows a cross-sectional view of a semiconductor device formed by a strain generating method of causing strain in a p-type channel region by application of a uniaxial compressive stress.
Figure 3:
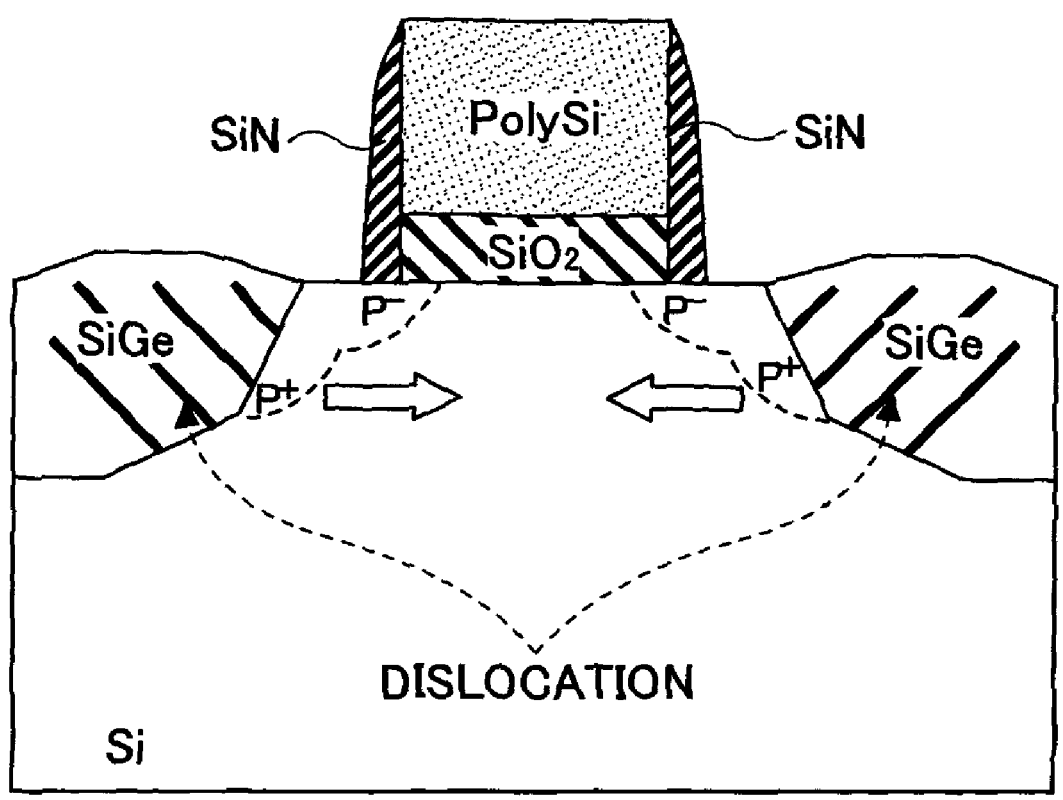
FIG. 3 is a schematic diagram for explaining reduction of the strain effect due to lattice defect.

According to the first embodiment, as shown in FIG. 4, the impurity regions 133 are formed on the silicon substrate 101 side along the interfaces 132 between the silicon substrate 101 and the SiGe strain generating layers 121. The initial source of dislocation in the first embodiment is lattice defects or dislocation loops (FIG. 1B) due to etching damage during the formation of the grooves 131. Because there is a possibility that the lattice defects and the dislocation loops may occur anywhere in the vicinity (on the silicon substrate 101 side) of the interfaces 132, the impurity regions 133 are formed throughout the vicinity of the interfaces 132 in the first embodiment.

Figure 8:
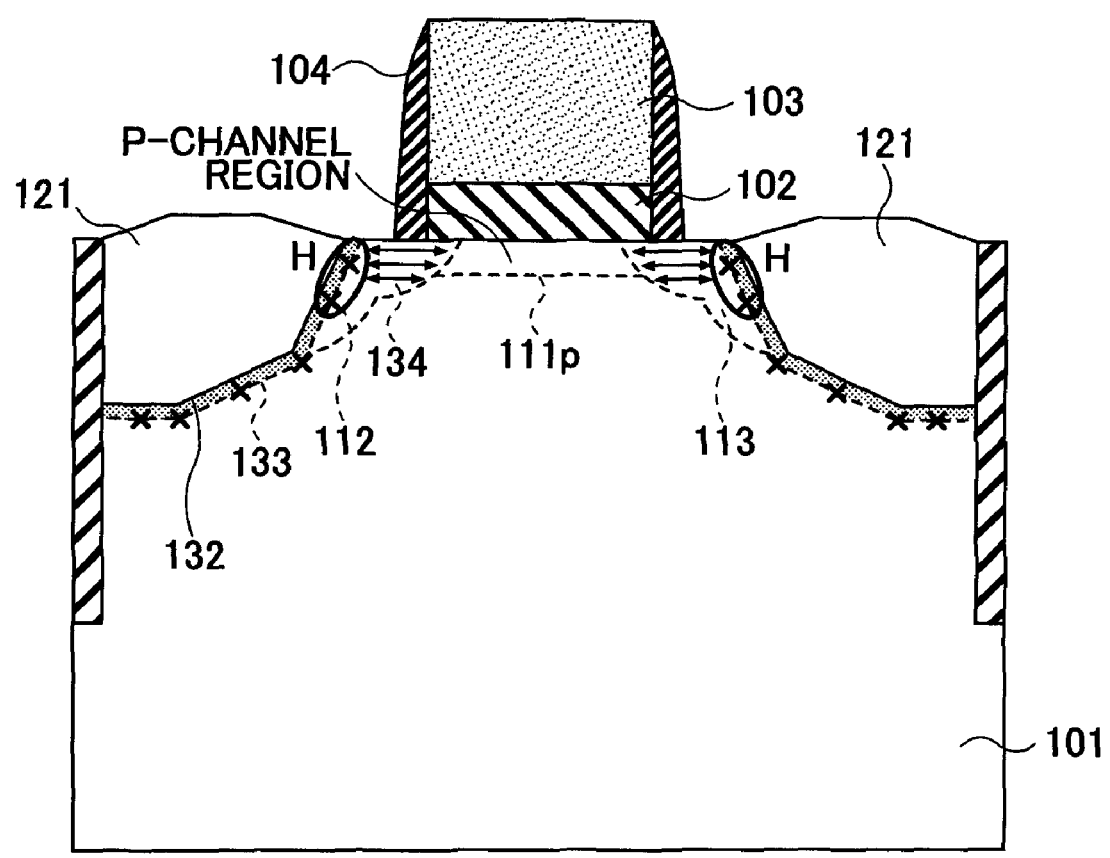
FIG. 8 shows a cross-sectional view of a semiconductor device for illustrating impurity regions according to the first embodiment.

FIG. 8 is a schematic diagram for explaining the impurity region 133 of the first embodiment. If the dislocation propagates to the channel region 111p and/or the strain generating regions 121, the propagated dislocation relieves the strain in the channel region 111p. This lowers the strain effect in the channel region 111p for carrier mobility enhancement. Or, a gate leakage current is increased. As can be seen, dislocation considered to be problematic in the first embodiment is the dislocation trying to propagate to the channel region 111p. Accordingly, a part where formation of the impurity regions 133 is most required in the vicinity of the interfaces 132 is regions H located at the same horizontal position as horizontal to the channel region 111p. This is because the regions H are closest to the channel region 111p.

The impurities contained in the impurity regions 133 are diffused in the SiGe layers 121 in a subsequent SiGe layer growth process so as to lock dislocation occurrence and expansion in the SiGe layers 121. If the dislocation propagates to the SiGe layers 121, the propagated dislocation relieves the strain in the channel region 111p. Therefore, pinning the dislocation in the SiGe layers 121 is also an important effect of the impurities contained in the impurity regions 133.

Figure 9:
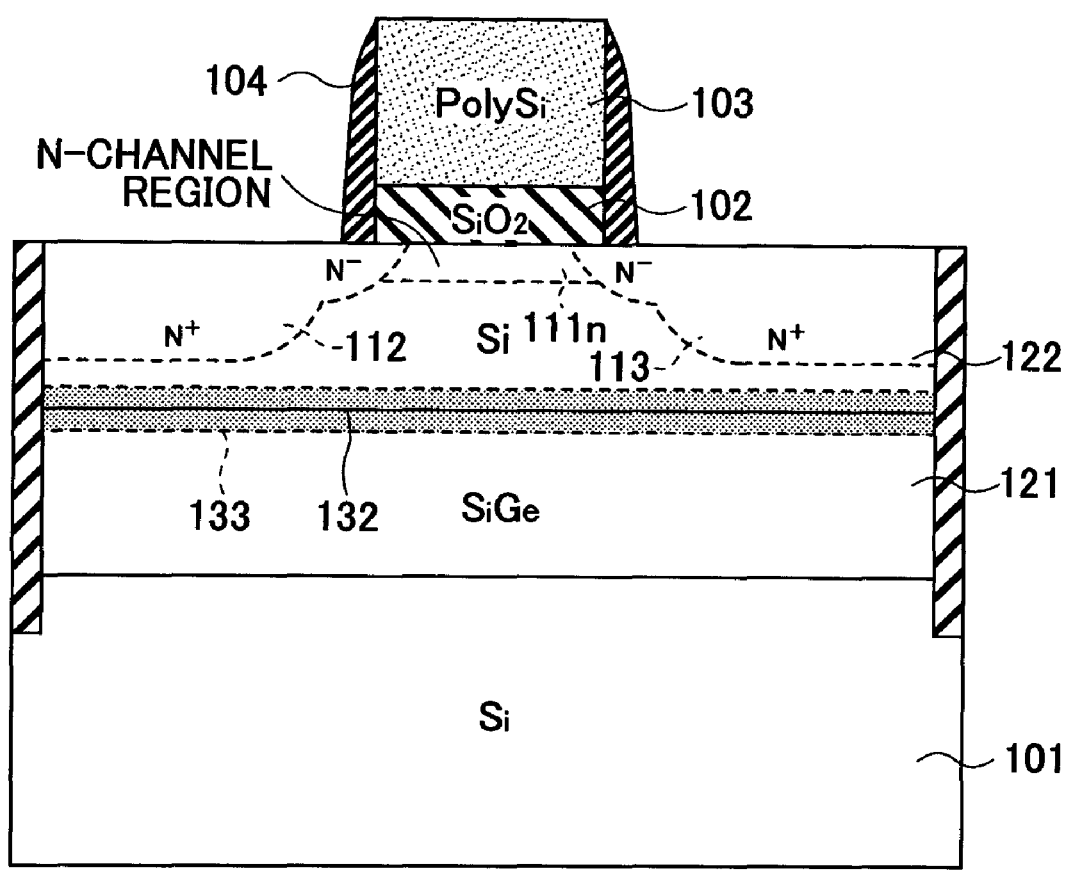
FIG. 9 shows a cross-sectional view of a semiconductor device according to a second embodiment.

Next, the second embodiment of the present invention is described in conjunction with FIGS. 9 through 11. FIG. 9 is a schematic cross-sectional diagram of a semiconductor device of the second embodiment, and FIGS. 10A through 10E illustrate a fabrication process of the semiconductor device shown in FIG. 9. In the second embodiment, a semiconductor device with an n-type MOSFET is fabricated.

The semiconductor device shown in FIG. 9 comprises a silicon substrate 101, a gate insulating film 102, a gate electrode 103, and a sidewall 104. The semiconductor device also comprises a semiconductor layer 122 that includes a n-channel region 111n, a source region 112, a drain region 113, and a SiGe strain generating layer 121 that applies a biaxial tensile stress to the n-channel region 111n. The SiGe strain generating layer 121 lies under the silicon layer 122 to be in contact therewith. The semiconductor layer 122 is made of Si, while the strain generating layer 121 is made of SiGe. The difference between the Si lattice constant and the SiGe lattice constant is a factor of generating the biaxial tensile stress. Since the channel region 111n is of an n-type in this example, the SiGe strain generating layer 121 of a tensile type is provided. On the other hand, if the channel region 111 is of a p-type, a carbon doped Si strain generating layer 121 of a compressive type is generally provided.

The semiconductor device of FIG. 9 also comprises impurity regions 133 formed in the vicinity of an interface 132 between the silicon layer 122 and the SiGe strain generating layer 121. The impurity regions 133 contain nitrogen or oxygen as impurities of $1.0\times10^{18}$ cm$^{-3}$ to $5.0\times10^{19}$ cm$^{-3}$.

Next, a fabrication method of the semiconductor device shown in FIG. 9 is described in conjunction with FIGS. 10A through 10E.

Figure 10A:
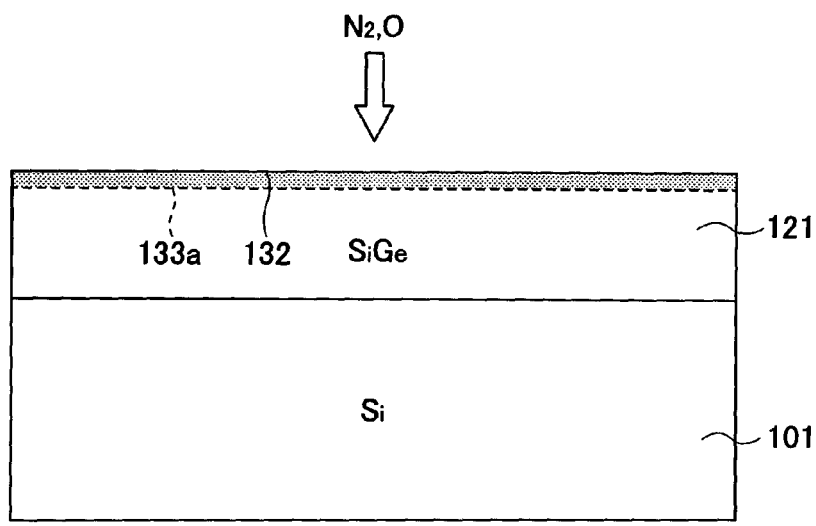
FIGS. 10A through 10E are cross-sectional views of a semiconductor device for illustrating a manufacturing method thereof according to the second embodiment.

First, referring to FIG. 10A, a SiGe layer 121 having a thickness of 1 μm is deposited on a surface of the silicon substrate 101 by a CVD process to form a SiGe strain generating layer 121. An impurity region 133a is formed in the SiGe strain generating layer 121 by ion implantation. The thickness of the impurity region 133a in the SiGe strain generating layer 121 is 10 nm to 40 nm. The concentration peak of the impurities in the impurity region 133a is $1.0\times10^{18}$ cm$^{-3}$ to $5.0\times10^{19}$ cm$^{-3}$, and the ion injection energy is around 10 KeV to 40 KeV.

Figure 10B:
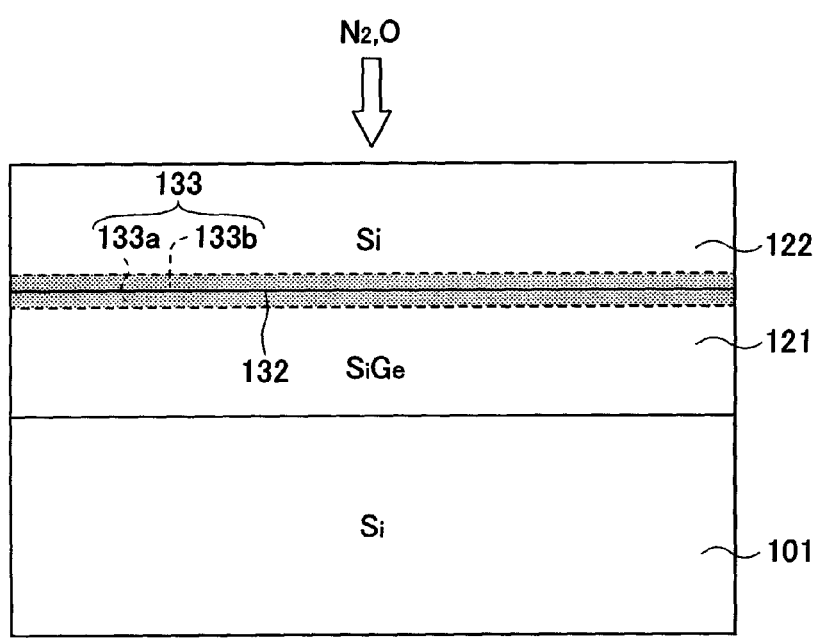

Then, referring to FIG. 10B, a Si layer 122 having a thickness of several tens of nanometers is deposited on the surface of the SiGe strain generating layer 121 by a CVD process. An impurity region 133b is formed in the silicon layer 122 by ion implantation. The thickness of the impurity region 133b in the silicon layer 122 is 10 nm. The concentration peak of the impurities in the impurity region 133b is $1.0\times10^{18}$ cm$^{-3}$ to $5.0\times10^{19}$ cm$^{-3}$. The impurity region 133a on the SiGe layer 121 side and the impurity region 133b on the Si layer 122 define an impurity region 133. Subsequently, an annealing process is performed for pinning initial dislocation by RTA at 800° C. through 1000° C. for several seconds.

Figure 10C:
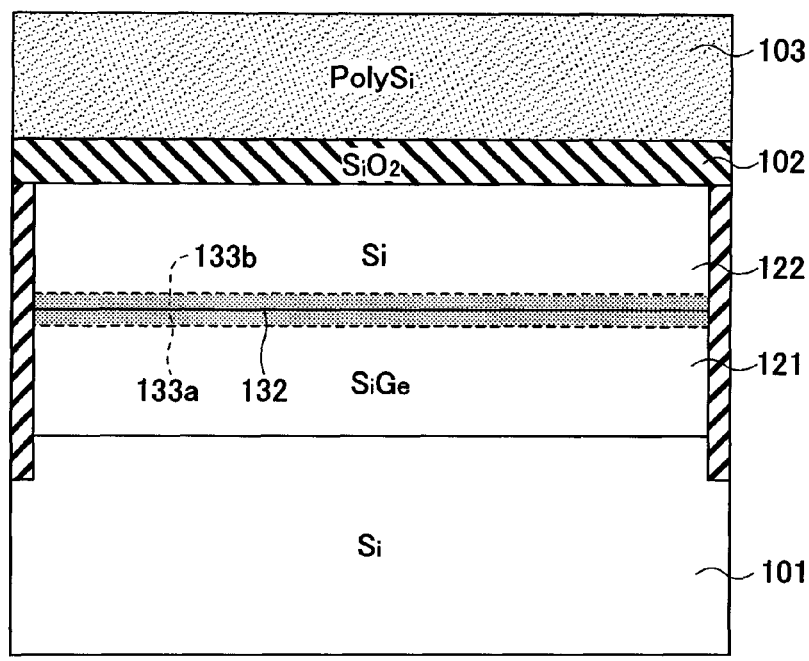

Then, referring to FIG. 10C, a SiO$_2$ film 102 having a thickness of 2 nm is deposited over the silicon layer 122 by thermal oxidation. A polysilicon layer 103 having a thickness of 100 nm is deposited on a surface of the SiO$_2$ film 102 by a CVD process.

Figure 10D:
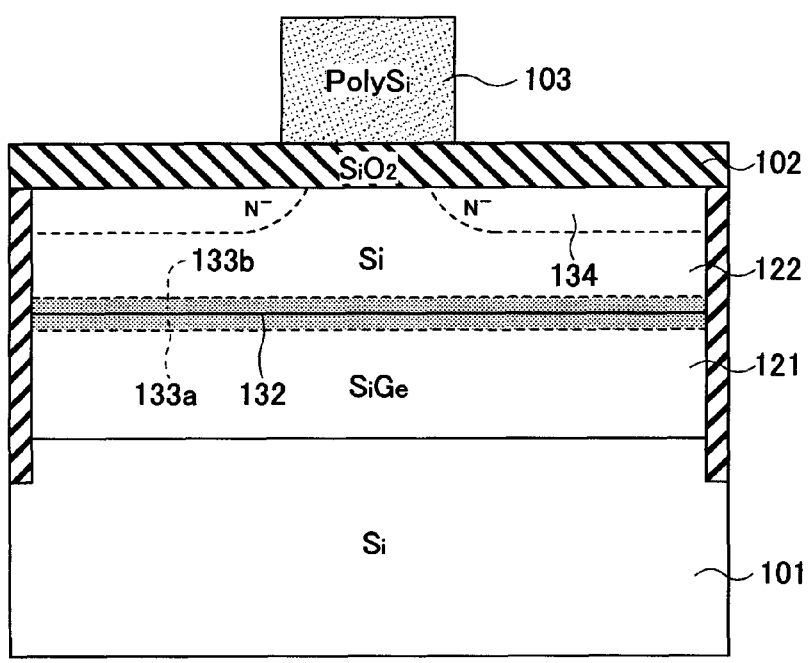

Then, referring to FIG. 10D, the polysilicon layer 103 is patterned into a gate electrode 103 by dry etching. Using the polysilicon gate electrode 103 as a mask, arsenic (As) ions or other suitable ions are injected into the Si layer 122 by ion implantation through the SiO$_2$ film 102 to form the n-region (extension) 134.

Figure 10E:
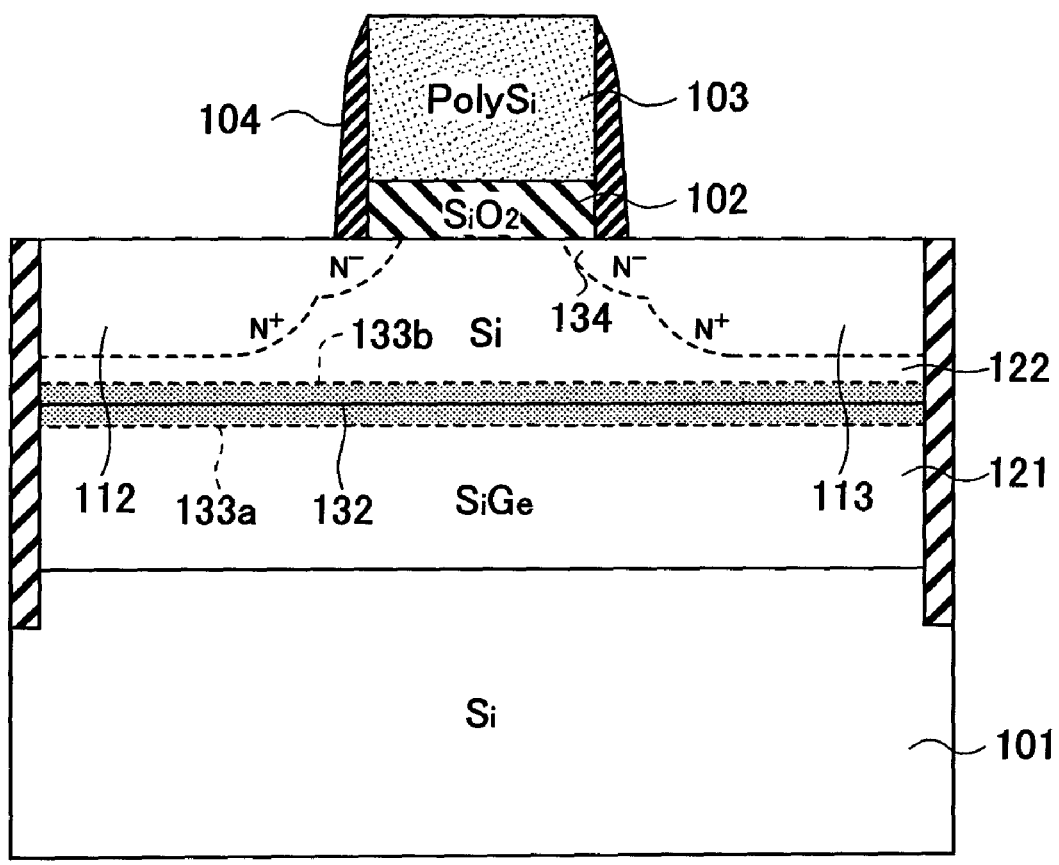

Then, referring to FIG. 10E, the SiO$_2$ film 102 is etched back to form the gate insulating film 102. A silicon nitride (SiN) film is deposited over the entire surface, and etched back by anisotropic etching to form a SiN side wall 104. Using the gate electrode 103 and the side wall 104 as the mask, ion implantation is performed to form an n+ regions (source and drain) 112 and 113 in the silicon layer 122.

FIG. 11 is a schematic diagram for explaining the impurity region 133 of the second embodiment. The impurity regions 133 are formed along or in the vicinity of the interface 132 between the silicon layer 122 and the SiGe strain generating layer 121. The initial source of dislocation in the second embodiment is through penetration (FIG. 1A) caused when the semiconductor layer 122 or the strain generating layer 121 is formed. Because there is a possibility that penetration may occur anywhere in the vicinity of the interface 132, the impurity regions 133 are formed throughout the vicinity of the interface 132 in the second embodiment.

If the dislocation propagates to the channel region 111n, the propagated dislocation relieves the strain in the channel region 111n. This lowers the strain effect in the channel region 111n for carrier mobility enhancement. As can be seen, dislocation considered to be problematic in the second embodiment is the dislocation trying to propagate to the channel region 111n. Accordingly, a part where formation of the impurity regions 133 is most required in the vicinity of the interface 132 is a region V indicated by the broken line block, which is located beneath the channel region 111n. This is because the region V is closest to the channel region 111n.

Concerning the concentration distribution of the impurities, the impurity regions 133b and 133a are formed in the silicon layer 122 and the SiGe strain generating layer 121, respectively, in the second embodiment. As illustrated in the impurity concentration distribution of the right-hand side of FIG. 11, a concentration peak of the impurities is observed in each of the silicon layer 122 and the SiGe strain generating layer 121.

The dislocation caused in the silicon layer 122 is mainly locked around the concentration peak P1 in the silicon layer 122. The dislocation caused in the SiGe strain generating layer 121 is mainly locked around the concentration peak P2 in the SiGe strain generating layer 121.

While the concentration peak of the impurities is set in each of the silicon layer 122 and the SiGe strain generating layer 121 in the second embodiment, the concentration peak may be set in either one of layers 122 or 121. In such a case, it is preferable to set the peak in the SiGe strain generating layer 121 from the viewpoint of preventing the reduction of the strain producing effect. Alternatively, the concentration peak may be set at the interface 132 between the silicon layer 122 and the SiGe strain generating layer 121 because a high concentration region extends to both the silicon layer 122 and the SiGe strain generating layer 121.

The above-described concentration distribution of the impurities applies not only to the second embodiment but also to the first embodiment.

Next, still another embodiment is described below. In this embodiment, point defect (self-interstitial atom/vacancies) is introduced in the SiGe strain generating layer 121 when forming the impurity region 133 in order to prevent the strain generating effect from being lowered. A SiGe/Si wafer with a silicon germanium (SiGe) layer grown over a silicon substrate is used as a sample.

<Preservation of Strain by Oxygen Implantation>

A sample is fabricated by forming a SiGe layer over a silicon substrate by epitaxial crystal growth and injecting oxygen ions. The germanium (Ge) content of SiGe is 7%, and the thickness of the SiGe layer is 340 nm.

Figure 12:
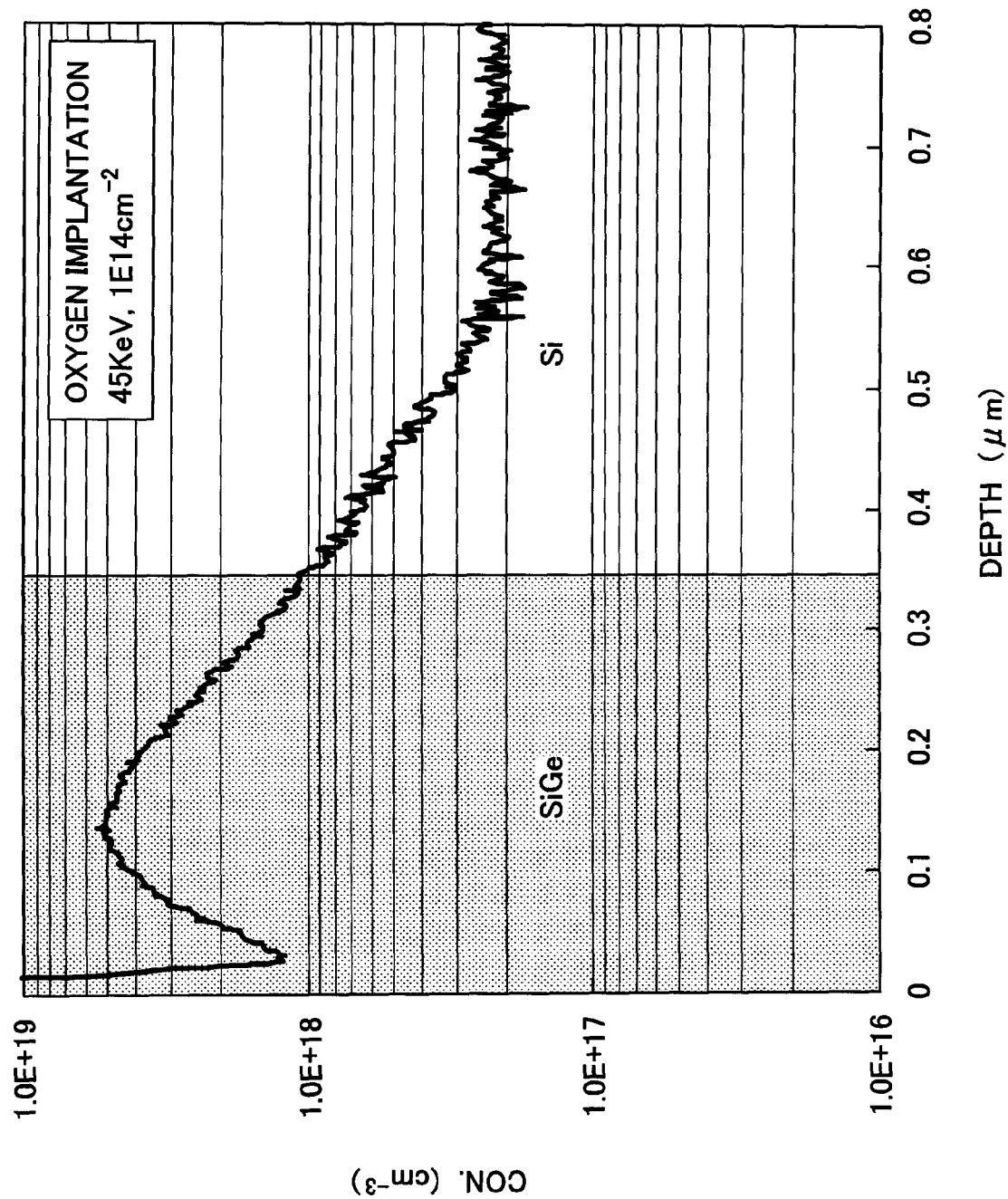
FIG. 12 is a graph showing a profile of oxygen concentration implanted in a SiGe/Si sample.

FIG. 12 is a graph of the oxygen concentration profile of the above-described sample in which oxygen ions are implanted under the conditions of 45 KeV and 1E14 cm$^{-2}$.

The oxygen distribution profile has a peak in the SiGe epitaxial layer. Although not shown in the figure, another sample in which oxygen ions are implanted under the conditions of 45 KeV and 6E13 cm$^{-2}$ has a peak at the same position, but with slightly reduced peak concentration as compared with the sample shown in FIG. 12.

Figure 13:
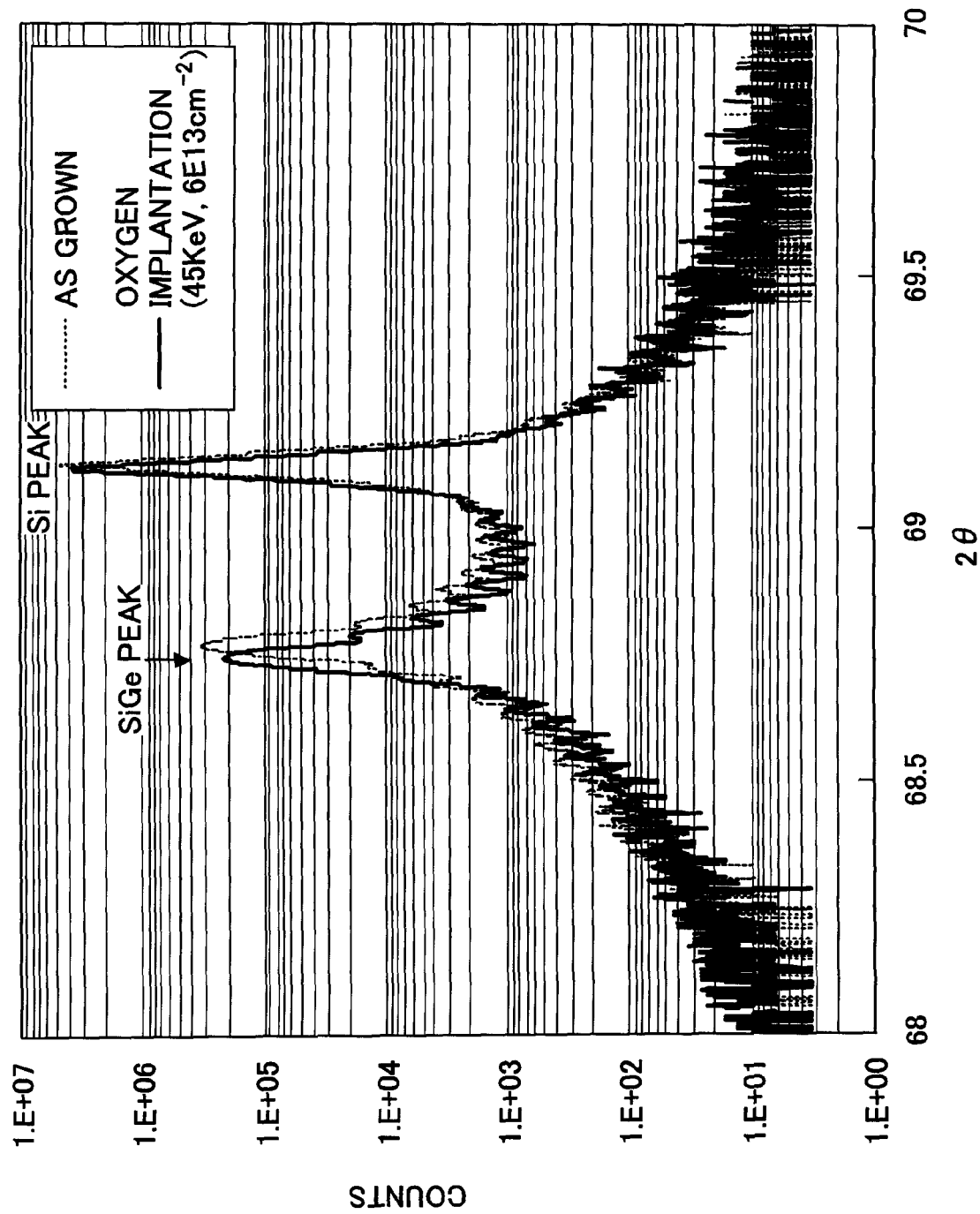
FIG. 13 is a graph of an X-ray diffraction after oxygen implantation.

FIG. 13 is a graph of X-ray diffraction, which graph is used to explain the strain preservation effect achieved by oxygen implantation. In the graph, the solid line represents the X-ray diffraction of the sample after oxygen ions are implanted, and the dotted line represents the X-ray diffraction of the sample immediately after the SiGe layer is grown (referred to as an "as grown" layer). The left-hand side peak is a SiGe peak, and the right-hand side peak is a silicon (Si) peak. The measurement is carried out by an out-of-plane method (for measuring a change of lattice constant in a direction perpendicular to the interface).

By oxygen implantation, the SiGe peak position shifts to a lower-angle side, which means that the SiGe lattice structure extends in the Z-axis direction (perpendicular to the interface of the epitaxial growth). The slight reduction of the peak intensity indicates the fact that lattice defect (point defect) is slightly produced in the SiGe lattice structure due to oxygen implantation. This slight lattice defect will be discussed later.

In X-ray diffraction using an in-plane method (for measuring the lattice constant within the X-Y plane, that is, in a direction parallel to the interface of the epitaxial growth), the SiGe crystals of both the oxygen-implanted sample and the as-grown sample align with silicon crystal of the Si substrate, and no change in lattice constant is observed in a direction parallel to the interface of the oxygen implantation. In the experiment using an in-plane method, the lattice constant is measured in the region from the SiGe surface up to the depth of 10 nm.

FIG. 14 is a table showing the measurement results using the out-of-plane method and the in-plane method.

The above-described X-ray diffraction result shows that the oxygen implantation causes the lattice constant of the epitaxial layer to extend perpendicular to the interface of the epitaxial growth, while maintaining the alignment with the substrate. This phenomenon can be explained as that the lattice spacing of the SiGe crystal increases by oxygen implantation, and that the lattice extends in the vertical direction in order to maintain the alignment with the silicon substrate at the interface. From the viewpoint of the change in germanium (Ge) content, the increase of the lattice constant corresponds to the increase of the apparent Ge content from 7% to 7.4%.

Figure 15:
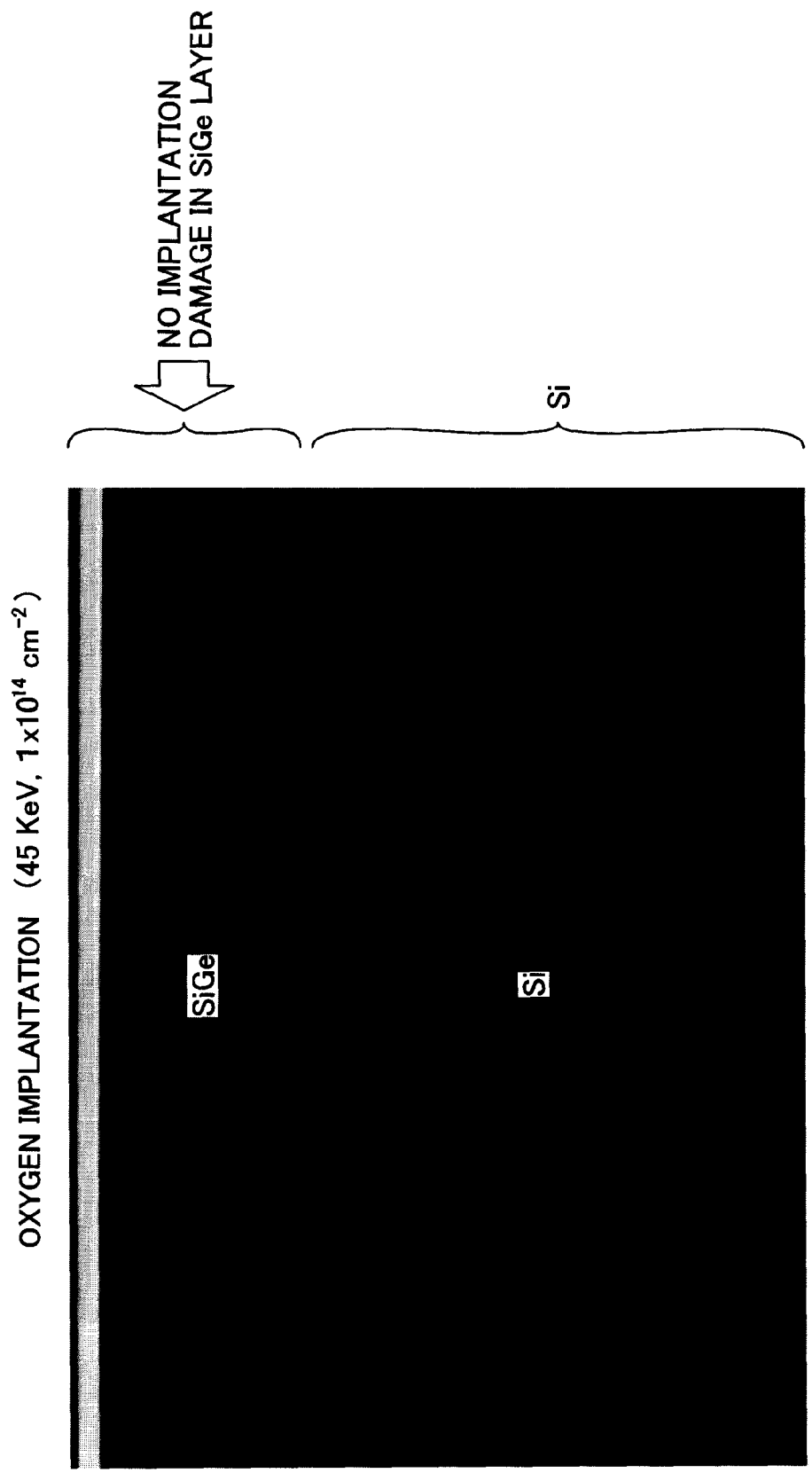
FIG. 15 is a cross sectional TEM tomograph of the oxygen implanted sample.

It is understood from the X-ray diffraction shown in FIG. 13 that lattice defect is slightly introduced by oxygen implantation. FIG. 15 is a cross sectional TEM tomograph taken in order to observe the introduced lattice defect. The TEM image does not indicate any specific damage in the SiGe layer. This means that the lattice defect introduced by the oxygen implantation is not a dislocation loop or an amorphous layer, but a microdefects that cannot be observed by a cross sectional TEM. In other words, it can be assessed that little damage due to oxygen implantation exists in the SiGe strain generating layer, and that the strain generating effect is quite dominant.

<Oxygen Implantation Effect as to Dislocation Mobility; Reduction of Dislocation Motion Velocity>

Next, the mobility of dislocation running from an artificially produced indentation is measured in an oxygen implanted sample, as compared with an as-grown sample.

The tip of a diamond pen is pressed against the surface of the SiGe epitaxial layer to form an indentation. The indentation is used as a dislocation source. Because of the presence of the indentation, dislocation is activated in the SiGe layer by the internal stress of the SiGe layer as long as the SiGe/Si system has a misfit stress.

Biaxial stress is acting on the SiGe/Si epitaxial system. The dislocation expands and propagates from the indentation (surface defect) toward both sides, reflecting the feature of the dislocation slip system of a diamond structure.

Figure 16:
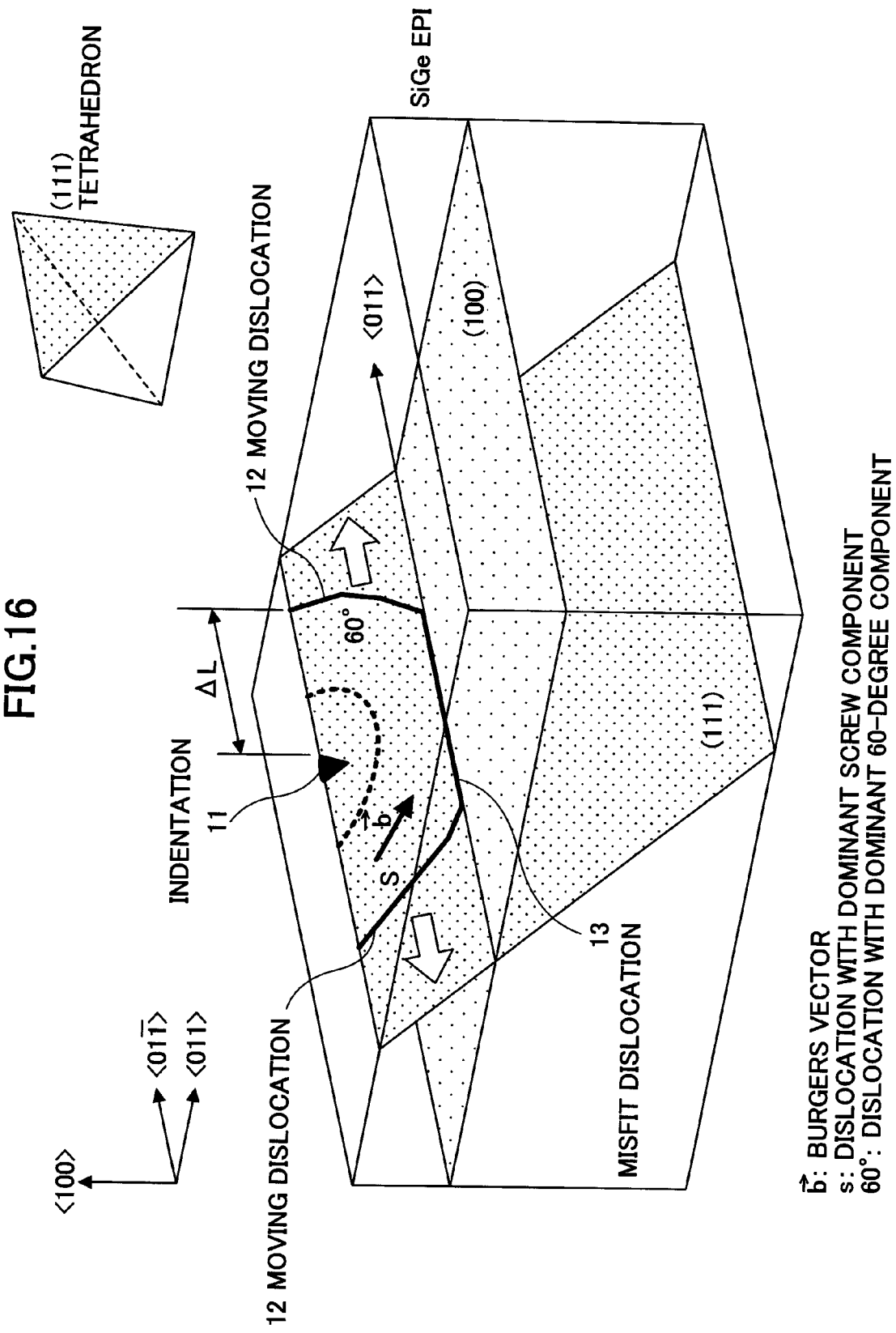
FIG. 16 is a schematic diagram for explaining the mechanism of dislocation motion without impurity implantation.

FIG. 16 is a schematic diagram for explaining the mechanism of migration of dislocation. There are four (111) planes that define dislocation slip systems, as illustrated by the (111) tetrahedron shown in the figure. The Burger's vector ($\vec{b}$) of dislocation in a diamond structure is in the <110> direction. There are two Burger's vectors in each of the (111) planes, and total of eight slip systems exist.

In FIG. 16, dislocation motion is depicted for a single Burger's vector in a single (111) plane for convenience sake. Moving dislocation 12 propagates through the lattice in the (111) plane, while expanding to both sides of the indentation 11, as indicated by the white arrows. The boundary between the (111) plane and the (100) plane is characterized by misfit dislocation 13. Taking all the slip systems into account, dislocation moves crosswise with the indentation as being the starting point. The symbol ΔL denotes the length of the moving dislocation.

Figure 17:
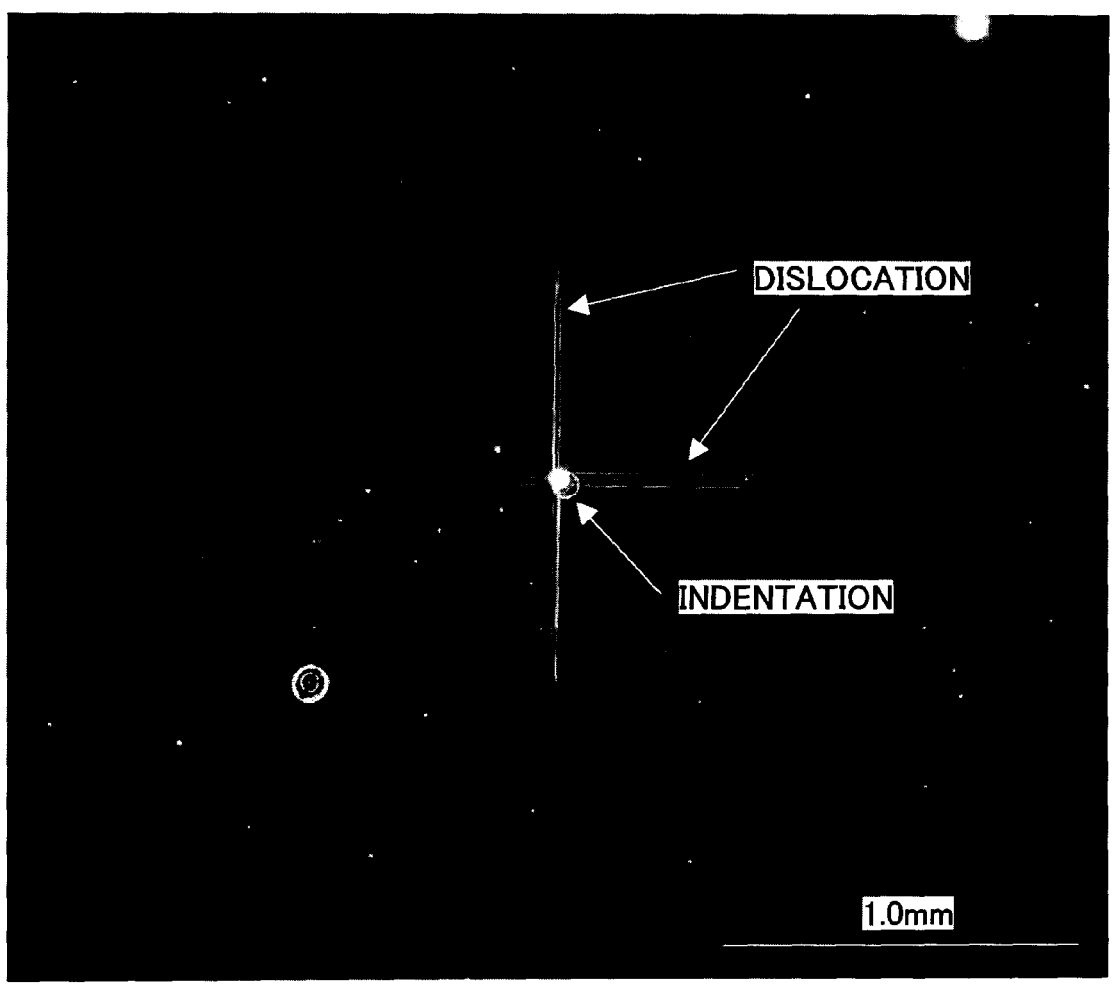
FIG. 17 is a photographic image of dislocations generated from an indentation in the SiGe/Si sample.

FIG. 17 is a photographic image observing the dislocation generated from the indentation. After a thermal process (such as an annealing process) at 550° C. for 210 minutes, selective etching is carried out using a secco etchant that can easily make observation of dislocations. It can be seen from the photograph that dislocations run crosswise from the indentation. By dividing the total length ΔL of the moving dislocation by a thermal process time Δt, an average mobility of dislocation in each thermal process period at a certain temperature can be determined.

Figure 18:
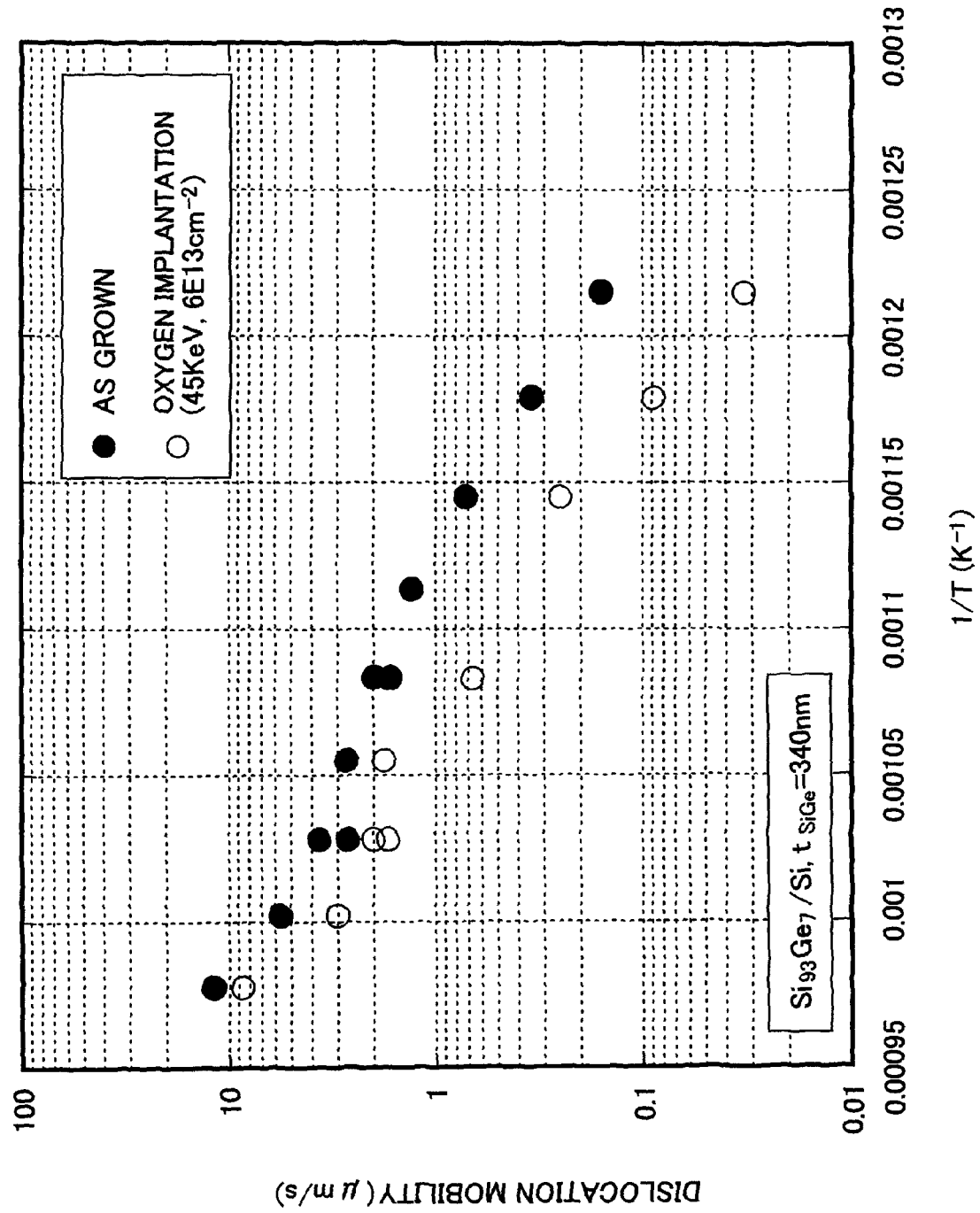
FIG. 18 is a graph showing the dislocation mobility reducing effect achieved by oxygen implantation.

FIG. 18 is a graph showing the temperature-dependency of dislocation mobility obtained by the above-described calculation. The dark circles are measurement results of dislocation mobility of the as-grown sample, and the white circles are measurement results of dislocation mobility of the oxygen implanted sample. It is concluded from the graph that oxygen implantation can reduce the dislocation motion velocity.

<Reduction of Density of Dislocation by Oxygen Implantation>

Figure 19B:
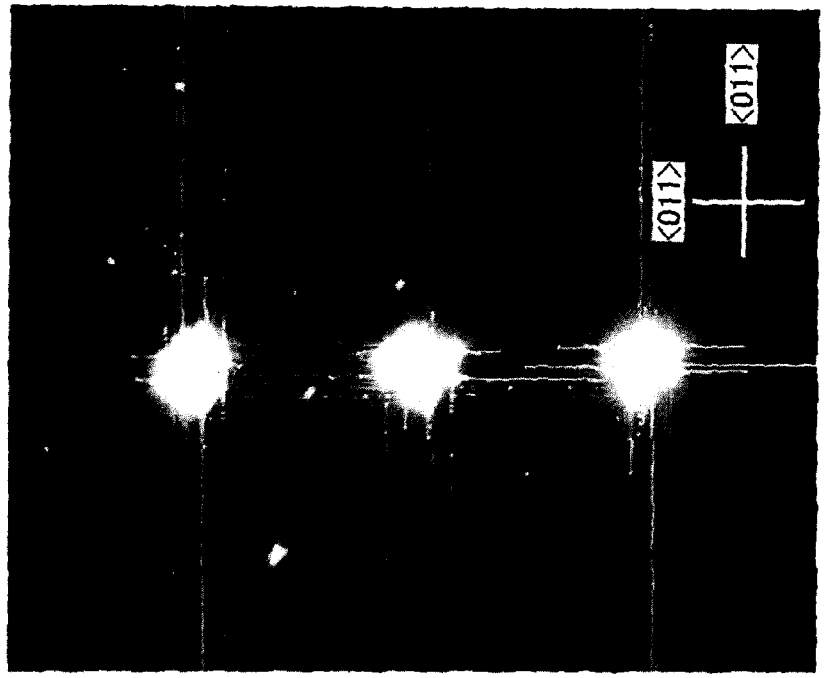
FIG. 19A and FIG. 19B are photographic images of dislocations expanding from indentations through thermal treatment applied to samples with and without oxygen implantation.
Figure 19A:
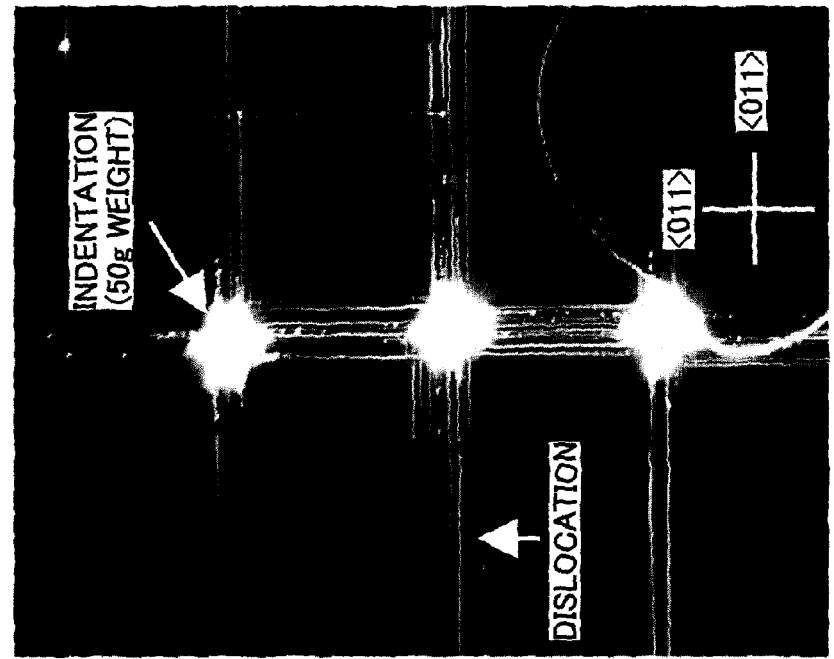

FIG. 19A and FIG. 19B are photographic images showing the effect of oxygen implantation for preventing dislocations from increasing. FIG. 19A is a photographic image of a sample with an as-grown SiGe layer, and FIG. 19B is a photographic image of an oxygen implanted sample. An indentation is introduced in each of the samples under prescribed control in order to count the number of dislocations running from the indentation. The indentation is formed using a hardenss tester under the application of the same weight (50 grams) so as to define the same shape.

After the indentation is formed, a thermal process is applied to both samples at 750° C. for 5 minutes to cause dislocations to be generated from the indentations. The densities of the generated dislocations in the two samples are compared with each other. The white streaks running in the horizontal and vertical directions in FIG. 19A (as-grown sample) and FIG. 19B (oxygen implanted sample) are dislocations. From the photographs, the density of generated dislocations is apparently reduced by introduction of oxygen ions in the sample.

It is inferred that this phenomenon is owing to the dislocation pinning effect of oxygen. The crystal lattice is disturbed by the indentation. At the beginning of the thermal process, the lattice starts recovering from the disturbance caused by the indentation; however, the disturbance cannot be fully recovered from and some defects partially remain. Among these defects, those that happen to land on the (111) plane start moving due to the internal stress of the epitaxial layer.

The reason why the dislocation density decreases in the oxygen implanted sample is that oxygen aggregates the dislocation (formation of Cottrel atmosphere) from running in the (111) plane during the recovery of the crystal lattice in the initial stage of annealing process and consequently the number of dislocations decreases.

<Preservation of Strain by Nitrogen Implantation>

Figure 20:
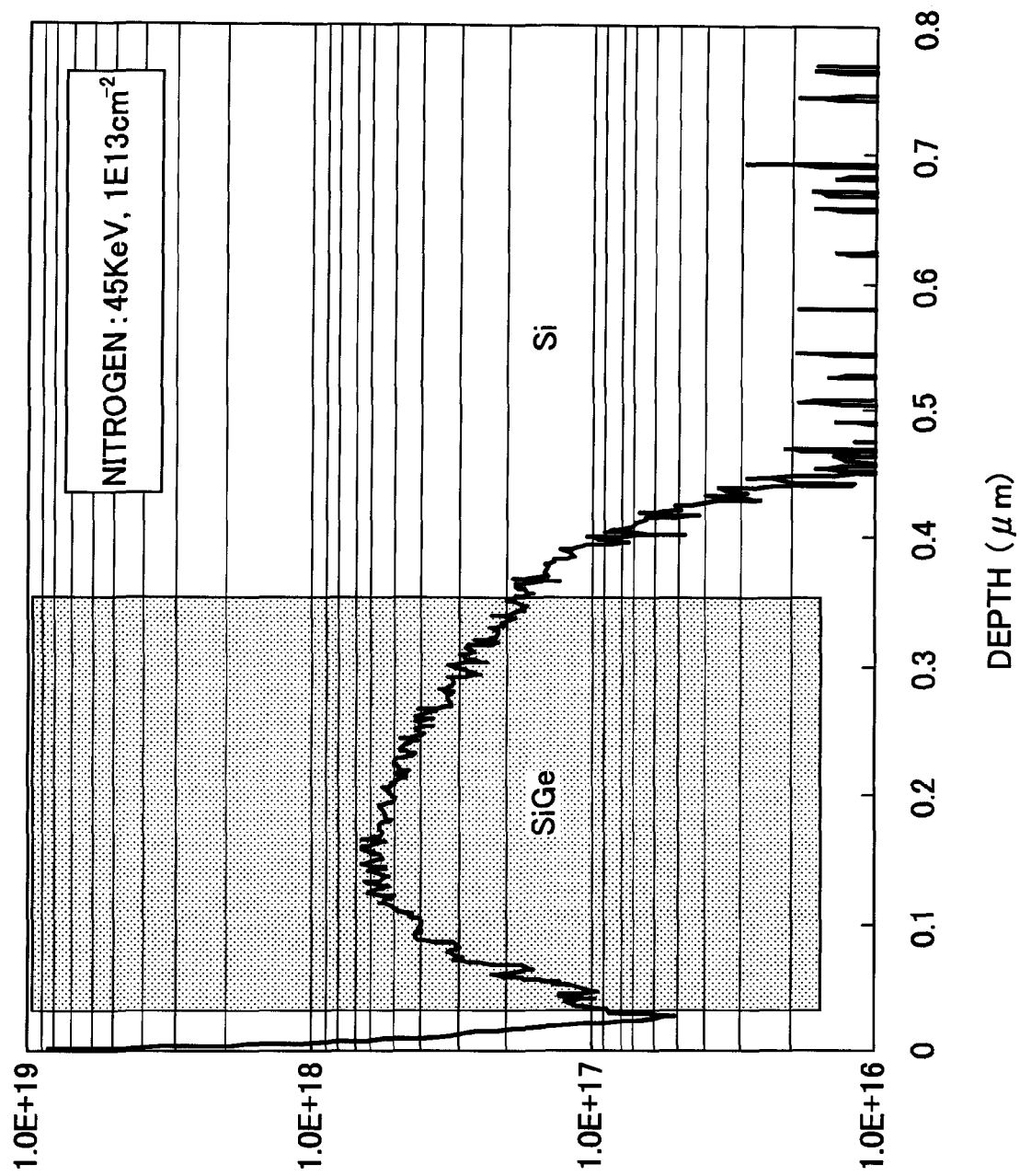
FIG. 20 is a graph showing a profile of nitrogen concentration implanted in a SiGe/Si sample.

Next, explanation is made of the strain preservation effect achieved by nitrogen implantation. FIG. 20 is a graph of the nitrogen concentration profile of a nitrogen implanted SiGe/Si sample. As in the oxygen implanted sample, the germanium (Ge) content of the SiGe epitaxial layer is 7%, and the thickness of the SiGe layer formed over the silicon substrate is 340 nm. The conditions of nitrogen implantation are 45 KeV and 1E13 cm$^{-2}$. The peak concentration is located in the SiGe layer. When the implantation conditions are changed to 45 KeV and 6E 13 cm$^{-2}$, the peak concentration increases by an order of magnitude, while the peak position does not change.

Figure 21:
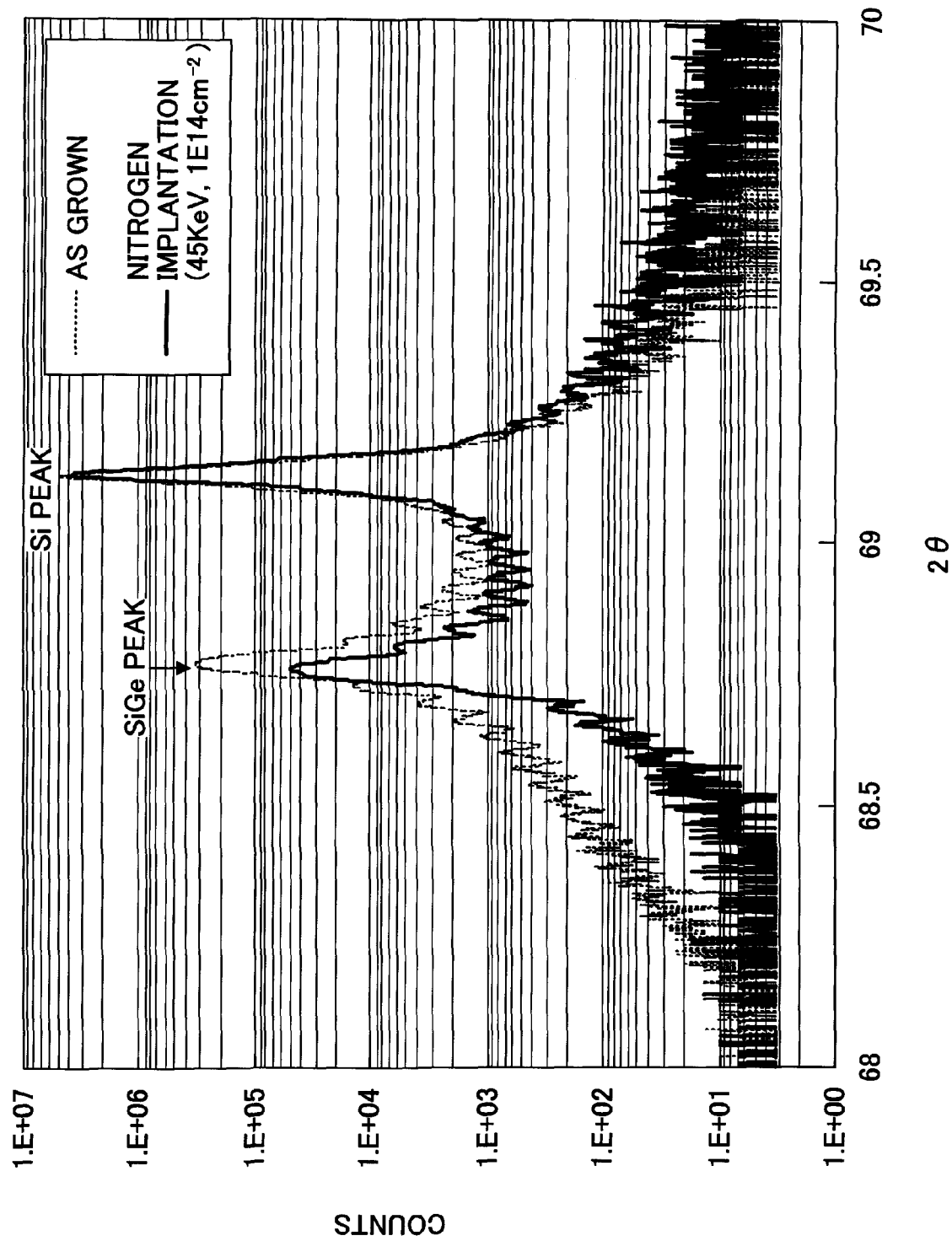
FIG. 21 is a graph of an X-ray diffraction after nitrogen implantation.

FIG. 21 is a graph showing the strain preservation effect achieved by nitrogen implantation. In the graph, the left-hand side peak is a SiGe peak, and the right-hand side peak is a silicon (Si) peak. The measurement is carried out by an out-of-plane method (for measuring a change of lattice constant in a direction perpendicular to the interface).

By nitrogen implantation, the SiGe peak position shifts to a lower-angle side, which means that the SiGe lattice structure extends in the Z-axis direction (perpendicular to the interface of the epitaxial growth). The slight reduction of the peak intensity indicates the fact that lattice defect (point defect) is slightly produced in the SiGe lattice structure due to nitrogen implantation. This lattice defect is too small to observe by TEM, similar to oxygen implantation.

The X-ray diffraction result shows that the nitrogen implantation causes the lattice constant of the epitaxial layer to extend perpendicular to the interface of the epitaxial growth because the lattice spacing of SiGe increases due to nitrogen implantation and the lattice structure expands in the vertical direction.

<Nitrogen Implantation Effect as to Dislocation Mobility; Reduction of Dislocation Motion Velocity>

The mobility of dislocation generated from an artificially produced indentation is measured in a nitrogen implanted sample, as compared with an as-grown sample. Similar to oxygen implantation, the tip of a diamond pen is pressed against the SiGe epitaxial layer to form the indentation to be used as a dislocation source. The total length (ΔL) of dislocation activated by a thermal process is divided by the thermal process time (Δt)

Biaxial stress is acting on the SiGe/Si epitaxial system. The dislocation expands and propagates from the indentation (surface defect) toward both sides, reflecting the feature of the dislocation slip system of a diamond structure.

FIG. 16 is a schematic diagram for explaining the mechanism of migration of dislocation. There are four (111) planes that define dislocation slip systems, as illustrated by the (111) tetrahedron shown in the figure. The Burger's vector ($\vec{b}$) of dislocation in a diamond structure is in the <110> direction. There are two Burger's vectors in each of the (111) planes, and total of eight slip systems exist.

In FIG. 16, dislocation motion is depicted for a single Burger's vector in a single (111) plane for convenience sake. Moving dislocation 12 propagates through the lattice in the (111) plane, while expanding to both sides of the indentation 11, as indicated by the white arrows. The boundary between the (111) plane and the (100) plane is characterized by misfit dislocation 13. Taking all the slip systems into account, dislocation moves crosswise with the indentation as being the starting point. The symbol ΔL denotes the length of the moving dislocation.

FIG. 17 is a photographic image observing the dislocation generated from the indentation. After a thermal process (such as an annealing process) at 550° C. for 210 minutes, selective etching is carried out using a secco etchant that can easily make observation of dislocations. It can be seen from the photograph that dislocations run crosswise from the indentation. By dividing the total length ΔL of the moving dislocation by a thermal process time Δt, an average mobility of dislocation in each thermal process period at a certain temperature can be determined.

Figure 22:
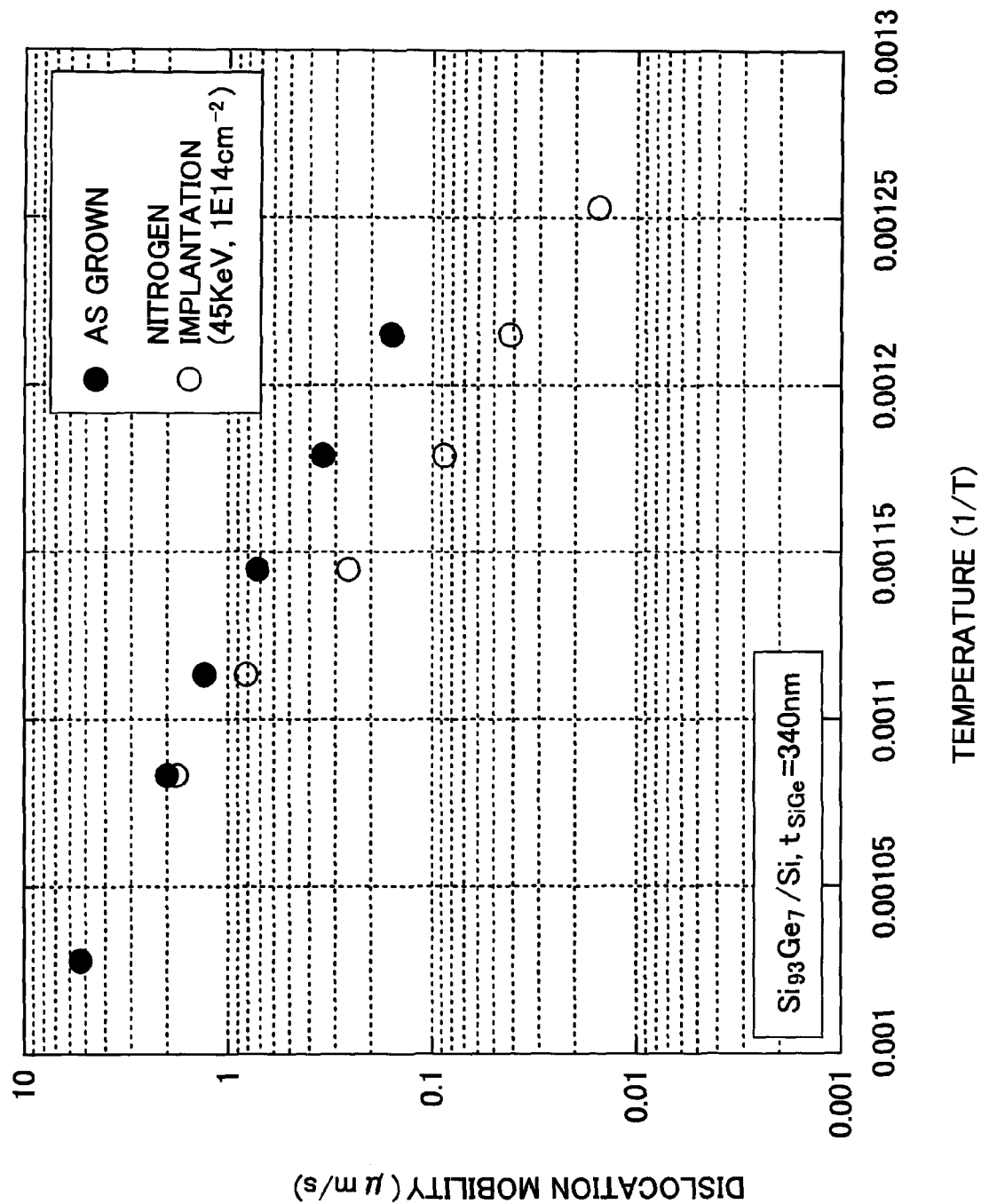
FIG. 22 is a graph showing the dislocation mobility reducing effect achieved by nitrogen implantation.

FIG. 22 is a graph showing the temperature-dependency of dislocation mobility obtained by the above-described calculation. The dark circles are measurement results of dislocation mobility of the as-grown sample, and the white circles are measurement results of dislocation mobility of the nitrogen implanted sample in which nitrogen ions are implanted under the conditions of 45 KeV and 1E14 cm$^{-2}$. It is concluded from the graph that nitrogen implantation can reduce the dislocation motion velocity.

<Reduction of Density of Dislocation by Nitrogen Implantation>

Figure 23A:
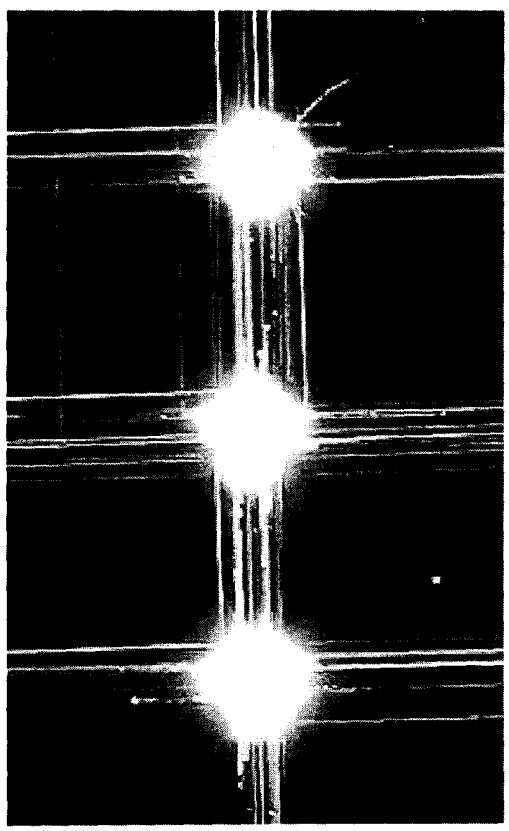
FIG. 23A and FIG. 23B are photographic images of dislocations expanding from indentations through thermal treatment applied to samples with and without nitrogen implantation.
Figure 23B:

FIG. 23A and FIG. 23B are photographic images showing the effect of nitrogen implantation for preventing dislocations from increasing. FIG. 23A is a photographic image of a sample with an as-grown SiGe layer, and FIG. 23B is a photographic image of a nitrogen implanted sample. An indentation is introduced in each of the samples under prescribed control in order to count the number of dislocations running from the indentation. The indentation is formed using a hardenss tester under the application of the same weight (50 grams) so as to define the same shape.

After the indentation is formed, a thermal process is applied to both samples at 750° C. for 5 minutes to cause dislocations to be generated from the indentations. The densities of the generated dislocations in the two samples are compared with each other. The white streaks running in the horizontal and vertical directions in FIG. 23A (as-grown sample) and FIG. 23B (nitrogen implanted sample) are dislocations. From the photographs, the density of generated dislocations is reduced apparently by introduction of nitrogen ions in the sample.

It is inferred that this phenomenon is owing to the dislocation pinning effect of nitrogen. The crystal lattice is disturbed by the indentation. At the beginning of the thermal process, the lattice starts recovering from the disturbance caused by the indentation; however, the disturbance cannot be fully recovered from and some defects partially remain. Among these defects, those dislocations that happen to land on the (111) plane start moving due to the internal stress of the epitaxial layer.

The reason why the dislocation density decreases in the oxygen implanted sample is that oxygen pinning the dislocations from running in the (111) plane during the recovery of the crystal lattice in the annealing process and consequently the number of moving dislocations decreases.

<Dislocation Mobility Reducing Mechanism by Point Defect Clusters>

Figure 24:
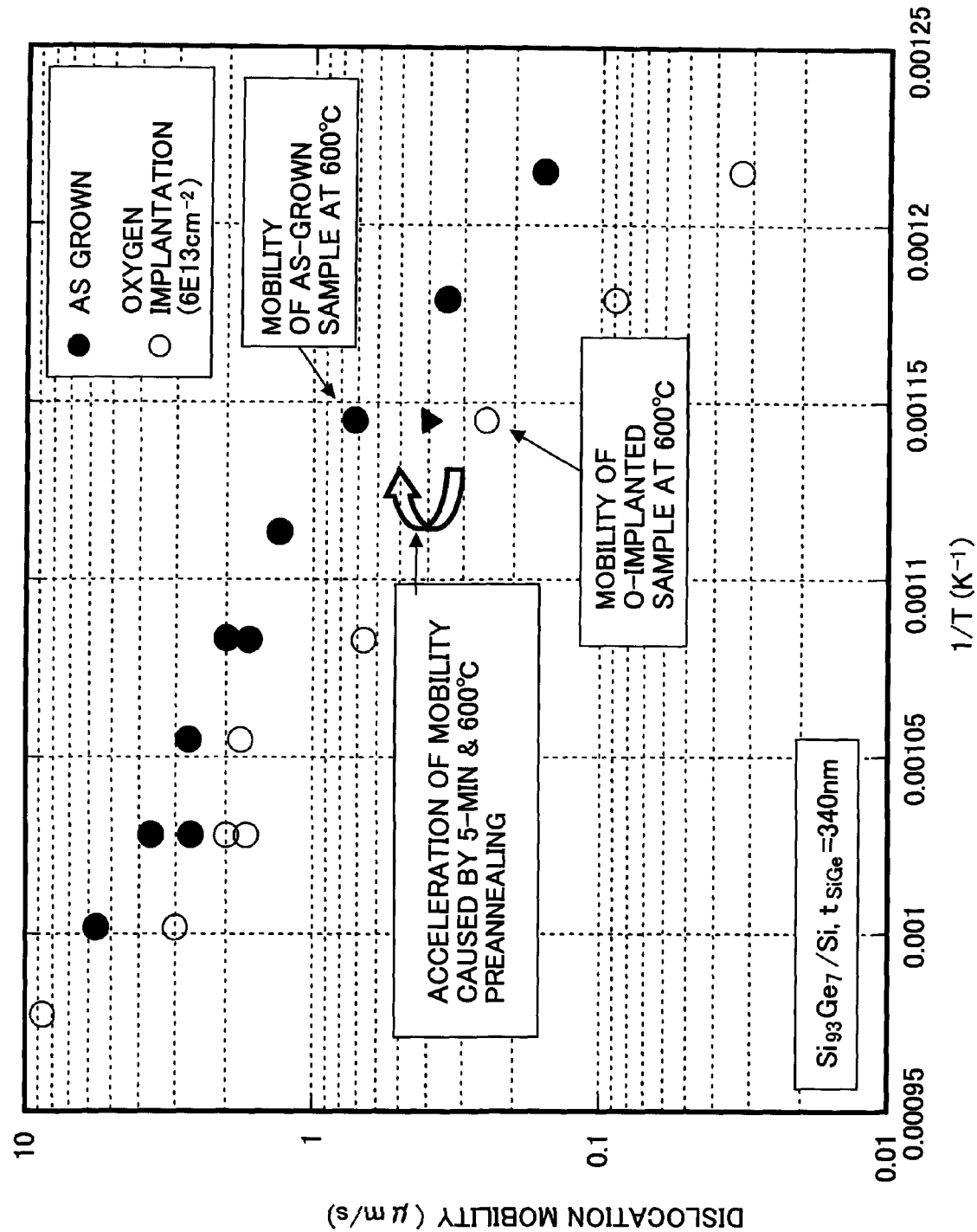
FIG. 24 is a graph for explaining recovery of dislocation mobility by preannealing.

FIG. 24 is a graph showing the fact that the reduced mobility of dislocation recovers through preannealing applied to the oxygen implanted sample. The dark circles indicate the dislocation mobility of the as-grown sample at 600° C., the white circles indicate the dislocation mobility of the oxygen implanted sample at 600° C., and the dark triangle indicates the dislocation mobility of the oxygen implanted sample that are subjected to five-minute preannealing at 700° C. prior to the mobility measurement. It is clearly understood from the graph that the mobility is increased by preannealing, as compared with the case in which no preannealing is carried out.

This means that, through the five-minute thermal treatment (preannealing) at 700° C., a certain factor introduced by oxygen implantation that prevents the dislocation motion is extinguished or reduced in concentration. In other words, the factor that suppresses dislocation mobility is some substance that disappears after relatively gentle thermal treatment for five minutes at 700° C., rather than the existence of oxygen ions themselves in the crystal lattice.

It is inferred that the substances that disappear in a short thermal process are small-sized cluster defects, such as self-interstitial atoms or vacancies produced by ion implantation. Accordingly, it is considered that the reduction of dislocation mobility achieved by oxygen implantation results from the point defect clusters produced by ion implantation that blocking the motion of dislocations.

Point defect clusters are thermally instable at a high temperature and easily dissociated. The recovery of dislocation mobility should become efficient as the preannealing temperature is higher.

Figure 25:
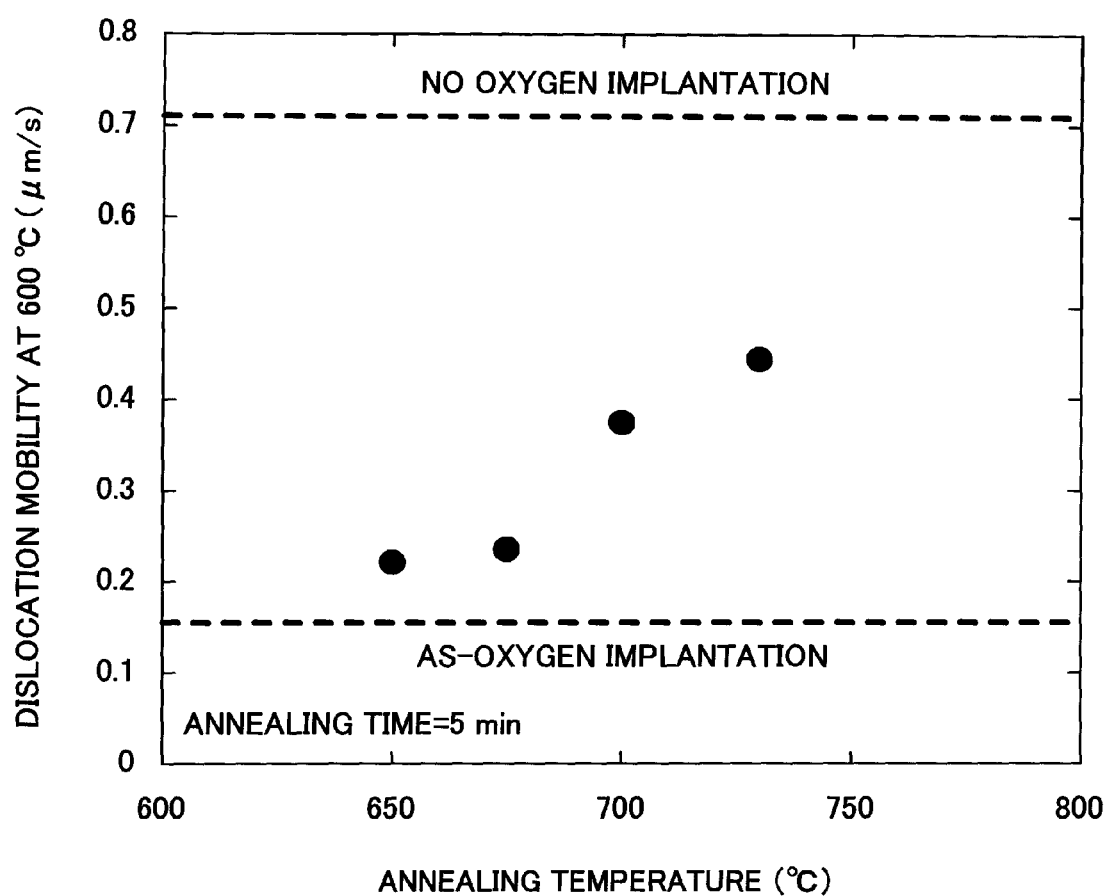
FIG. 25 is a graph showing the relationship between the recovery of the dislocation mobility and the annealing temperature.

FIG. 25 is a graph indicating the relationship between the annealing temperature and the degree of recovery of the reduced dislocation mobility. The higher the preannealing temperature, the greater the recovery of dislocation mobility is.

FIG. 26 is a schematic diagram illustrating the mechanism of reducing dislocation mobility based upon mutual interaction between moving dislocations and point defect clusters. During migration of dislocation 12 in the directions indicated by the white arrows, the dislocation 12 receives resistance by the point defect clusters 15 produced in the epitaxial layer by impurity implantation, and is prevented from further migration. Consequently, the mobility of dislocation is suppressed. If the point defect clusters 15 are eliminated or reduced by preannealing, the suppressed dislocation mobility is recovered.

Such point defect clusters 15 are so small that they cannot be observed by TEM, as illustrated in FIG. 15. Accordingly, damage to the crystal is trivial, while conspicuous effect for reducing dislocation mobility is achieved. To be more precise, self-interstitial atoms and/or vacancies gather together to form clusters, and block dislocations from running. The same applies to nitrogen implantation.

From the above, it is considered that the dislocation mobility reducing effect realized by oxygen or nitrogen implantation is actually achieved by point defect clusters produced by the ion implantation, while the dislocation density reducing effect is achieved by the pinning effect of oxygen or nitrogen itself. In conclusion, in the two different aspects of suppressing dislocation mobility and reducing the density of generation of dislocation, the factors contributing to these effects are independent of each other.

To solely suppress the dislocation mobility, producing point defect clusters is sufficient. Accordingly, carbon (C), arsenic (As), phosphorous (P), antimony (Sb), boron (B), and germanium (Ge) can be used, in addition to oxygen (O) and nitrogen (N), as impurity to be introduced in the impurity region.

However, in order to simultaneously reduce the dislocation generation density, oxygen and nitrogen having the dislocation pinning effect are appropriately used. Boron (B) and other listed atoms cannot sufficiently reduce the dislocation generation density although they can suppress the dislocation mobility.

While the present invention has been described in terms of the above illustrated embodiments, it will be apparent to those skilled in the art that variations and modifications may be made without departing from the scope of the invention as set forth in the accompanying claims. For example, although in the above-described embodiment ion implantation is employed to produce vacancies, self-interstitial atoms, and the clusters thereof, the invention is not limited to this method. As long as point defect clusters are formed at or near the boundary between the strain generating layer (such as a SiGe layer) and the strain receiving layer (such as a Si layer), arbitrary impurity introducing methods may be employed.

What is claimed is:

1. A semiconductor device, comprising:
    a semiconductor substrate;
    a gate electrode formed over the semiconductor substrate;
    a source extension region and a drain extension region having a first depth formed in the semiconductor substrate;
    a source region and a drain region having a second depth greater than the first depth formed in the semiconductor substrate;
    a first semiconductor layer including SiGe formed in the source region and a second semiconductor layer including SiGe formed in the drain region;
    a first impurity region including at least one of oxygen and carbon located between the first semiconductor layer and the source extension region, and a second impurity region including at least one of oxygen and carbon located between the second semiconductor layer and the drain extension region;
    wherein concentration of the oxygen or the carbon is $1.0 \times 10^{18}$ cm$^{-3}$ to $5.0 \times 10^{19}$ cm$^{-3}$;
    wherein the impurity region includes self-interstitial atoms and/or vacancies; and
    wherein the impurity region is a conductive region.

* * * * *